US009966877B2

(12) United States Patent
Yamamoto

(10) Patent No.: US 9,966,877 B2
(45) Date of Patent: May 8, 2018

(54) ELECTRIC POWER CONVERSION DEVICE

(71) Applicant: Toyota Jidosha Kabushiki Kaisha, Toyota, Aichi-ken (JP)

(72) Inventor: Kazunari Yamamoto, Miyoshi (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days. days.

(21) Appl. No.: 15/426,553

(22) Filed: Feb. 7, 2017

(65) Prior Publication Data
US 2017/0229979 A1 Aug. 10, 2017

(30) Foreign Application Priority Data

Feb. 9, 2016 (JP) ................. 2016-023133

(51) Int. Cl.
*H02M 7/5395* (2006.01)
*H02M 1/088* (2006.01)
(Continued)

(52) U.S. Cl.
CPC ......... *H02M 7/5395* (2013.01); *H02M 1/088* (2013.01); *H02M 3/158* (2013.01); *H03K 17/04* (2013.01); *H02M 2001/0003* (2013.01); *H02M 2001/327* (2013.01); *H02P 27/08* (2013.01); *H02P 29/68* (2016.02)

(58) Field of Classification Search
CPC .......... H02M 7/42; H02M 7/48; H02M 7/487; H02M 7/493; H02M 7/501; H02M 7/4826; H02M 7/49; H02M 7/4807; H02M 7/537; H02M 7/5387; H02M 2007/4803; H02M 2007/4822; H02H 9/026; H02H 3/085; H01C 7/008; H01C 7/02; H01C 7/04; H01C 7/06; G01R 31/2607; G01R 31/2874; G01R 31/2891
See application file for complete search history.

(56) References Cited

U.S. PATENT DOCUMENTS

2017/0302262 A1* 10/2017 Hirata .............. H03K 17/08122

FOREIGN PATENT DOCUMENTS

JP 2007-195343 A 8/2007
JP 2011-172336 A 9/2011
(Continued)

Primary Examiner — Timothy J Dole
Assistant Examiner — Bryan R Perez
(74) Attorney, Agent, or Firm — Dinsmore & Shohl LLP

(57) ABSTRACT

An electric power conversion device includes: a first switching element; a second switching element; a control device; a first temperature sensor; a second temperature sensor; a first transmission circuit; and a second transmission circuit, wherein the control device has a storage device, and the control device is configured to: calculate a calculated temperature using a first signal and a correction amount; control the operations of the first switching element and the second switching element based on the calculated temperature; and add the difference between a first comparison temperature and the calculated temperature to the correction amount when the control device determines that a first comparison result changes from lower than the first comparison temperature to equal to or higher than the first comparison temperature, and that the calculated temperature is lower than the first comparison temperature.

9 Claims, 14 Drawing Sheets

(51) Int. Cl.
  *H02M 3/158* (2006.01)
  *H03K 17/04* (2006.01)
  *H02M 1/00* (2006.01)
  *H02P 27/08* (2006.01)
  *H02M 1/32* (2007.01)
  *H02P 29/68* (2016.01)

(56) References Cited

FOREIGN PATENT DOCUMENTS

| | | | |
|---|---|---|---|
| JP | 2011-205735 | A | 10/2011 |
| JP | 2012-191724 | A | 10/2012 |
| JP | 2013-095147 | A | 5/2013 |

* cited by examiner

ELECTRIC POWER CONVERSION DEVICE

CROSS-REFERENCE TO RELATED APPLICATIONS

This application claims priority to Japanese Patent Application No. 2016-023133 filed on Feb. 9, 2016, the entire contents of which are hereby incorporated by reference.

BACKGROUND

1. Field of the Disclosure

A technique disclosed in this specification relates to an electric power conversion device.

2. Description of Related Art

An electric power conversion device uses a plurality of switching elements for switching a large current connected in parallel with one another. The electric power conversion device needs to perform control such that the switching elements are not overheated, and in a case where the switching elements are about to be overheated, a control unit configured to limit supply electric power or the like to prevent overheating is used. An electric power conversion device disclosed in Japanese Patent Application Publication No. 2013-095147 (JP 2013-095147 A) includes a plurality of switching elements, a temperature sensor configured to detect the temperatures of a plurality of switching elements, and a control unit configured to control the operation of the electric power conversion device based on the temperatures detected by the temperature sensor. In the electric power conversion device of JP 2013-095147 A, the temperatures of a plurality of switching elements incorporated in the electric power conversion device are detected by the single temperature sensor in a lump, and the operation of the electric power conversion device is controlled based on the detected temperatures.

In the electric power conversion device of JP 2013-095147 A, since the temperatures of a plurality of switching elements are detected by the single temperature sensor in a lump, in a case where there is the difference in temperature between the elements, it is not possible to distinguish the difference. In a case where there are a high-temperature switching element and a low-temperature switching element among a plurality of switching elements, the temperature sensor may detect an intermediate temperature. However, in a case where a high-temperature switching element and a low-temperature switching element are mixed, some embodiments control the operation of the electric power conversion device based on the temperature of the high-temperature switching element. This is because it is possible to control the operation of the electric power conversion device to prevent overheating of the high-temperature switching element.

In order to distinguish the temperature of each of a plurality of switching elements, a configuration in which a temperature sensor is arranged for each switching element, and the temperature of the switching element detected by each temperature sensor is transmitted to the control unit is required. Then, the configuration becomes complicated, and the device becomes expensive. In particular, in a case where an operating voltage on the switching element side is different from an operating voltage on the control unit side, a temperature signal needs to be transmitted while insulating both sides from each other, and an expensive insulating coupler is required in order to transmit an accurate temperature signal.

SUMMARY

Accordingly, the present disclosure provides a technique capable of controlling the operation of an electric power conversion device based on the temperature of a high-temperature switching element among a plurality of switching elements.

The first aspect of the present disclosure is An electric power conversion device including: a first switching element; a second switching element connected in parallel with the first switching element; a control device having a central processing unit, the control device being configured to perform calculation and control by the central processing unit; a first temperature sensor configured to detect the temperature of the first switching element; a second temperature sensor configured to detect the temperature of the second switching element; a first transmission circuit configured to transmit a first signal indicating the temperature of the first switching element detected by the first temperature sensor to the control device; and a second transmission circuit configured to transmit, to the control device, a first comparison result indicating that the temperature of the second switching element detected by the second temperature sensor is equal to or higher than a predetermined first comparison temperature, wherein the control device has a storage device configured to store the first comparison temperature and a correction amount, and the control device is configured to: calculate a calculated temperature using the first signal and the correction amount; control the operations of the first switching element and the second switching element based on the calculated temperature; and add the difference between the first comparison temperature and the calculated temperature to the correction amount when the control device determines that the first comparison result changes from lower than the first comparison temperature to equal to or higher than the first comparison temperature, and that the calculated temperature is lower than the first comparison temperature.

According to the above-described aspect, even if the detection values of all temperature sensors are not fed to the control device, it is possible to control the operations of the switching elements based on the temperature of a high-temperature switching element among a plurality of switching elements.

The second aspect of the present disclosure is an electric power conversion device including: a first switching element; a second switching element connected in parallel with the first switching element; a third switching element connected in parallel with the first switching element and the second switching element; a control device having a central processing unit, the control device being configured to perform calculation and control by the central processing unit; a first temperature sensor configured to detect the temperature of the first switching element; a second temperature sensor configured to detect the temperature of the second switching element; a third temperature sensor configured to detect the temperature of the third switching element; a first transmission circuit configured to transmit a first signal indicating the temperature of the first switching element detected by the first temperature sensor to the to the control device; a second transmission circuit configured to transmit a first comparison result indicating whether or not the temperature of the second switching element detected by the second temperature sensor is equal to or higher than a predetermined first comparison temperature; a third transmission circuit configured to transmit a second comparison result indicating whether or not the temperature of the third switching element detected by the third temperature sensor is equal to or higher than a predetermined second comparison temperature; and a fourth transmission circuit configured to transmit the first comparison result and the second comparison result to the control device through an OR circuit, wherein the control device has a storage device configured to store the first comparison temperature, the second comparison temperature, and a correction amount, and the control device is configured to: calculate a calculated temperature using the first signal and the correction amount; control the operations of the first switching element, the second switching element, and the third switching element based on the calculated temperature; and add the difference between the high-temperature comparison temperature and the calculated temperature to the correction amount when the control device determines that the first comparison result changes from lower than the first comparison temperature to equal to or higher than the first comparison temperature or that the second comparison result changes from lower than the second comparison temperature to equal to or higher than the second comparison temperature, and that the calculated temperature is lower than a temperature of a high-temperature comparison temperature which is a higher temperature out of the first comparison temperature and the second comparison temperature.

According to the above-described aspect, it is possible to control the operation based on the temperature of the high-temperature switching element among a plurality of switching elements even with a simple configuration.

BRIEF DESCRIPTION OF THE DRAWINGS

Features, advantages, and technical and industrial significance of exemplary embodiments will be described below with reference to the accompanying drawings, in which like numerals denote like elements, and wherein.

DETAILED DESCRIPTION OF EMBODIMENTS

First Example

Figure 1:
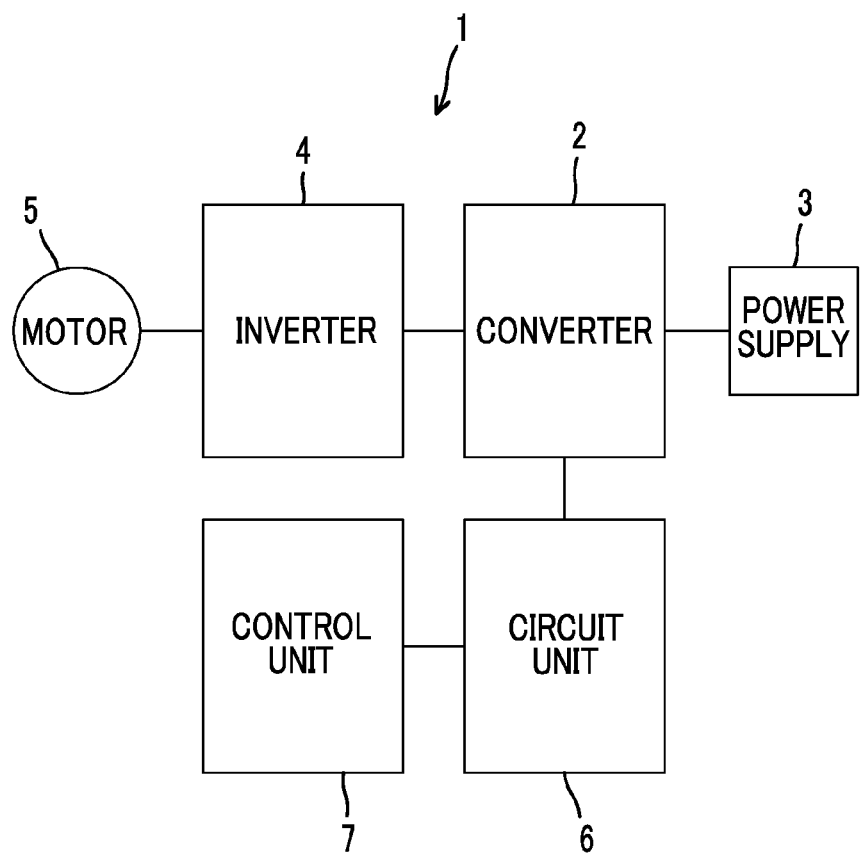
FIG. 1 is a block diagram of an electric power conversion device according to a first example.

As shown in FIG. 1, an electric power conversion device 1 according to a first example includes a converter 2, an inverter 4, a circuit unit 6, and a control unit 7. The converter 2 and the inverter 4 are electrically connected to each other. The converter 2 is connected to a power supply 3, and the inverter 4 is connected to a motor 5.

The power supply 3 is, for example, a storage battery or a fuel battery. The power supply 3 supplies electric power to the motor 5 through the converter 2 and the inverter 4. The converter 2 boosts and outputs electric power supplied from the power supply 3. The configuration of the converter 2 will be described. The inverter 4 converts DC power output from the converter 2 to AC power and outputs AC power. Though not shown, the inverter 4 has a structure in which three sets of two switching elements connected in series with each other are connected in parallel with one another. The configuration of the inverter 4 is well known, and thus, detailed description thereof will not be repeated. In FIG. 1, a control device of the inverter 4 is not shown. The motor 5 rotates with electric power supplied from the power supply 3 through the converter 2 and the inverter 4. The motor 5 is, for example, a motor for traveling in a hybrid vehicle, a fuel battery vehicle, an electric vehicle, or the like.

Figure 2:
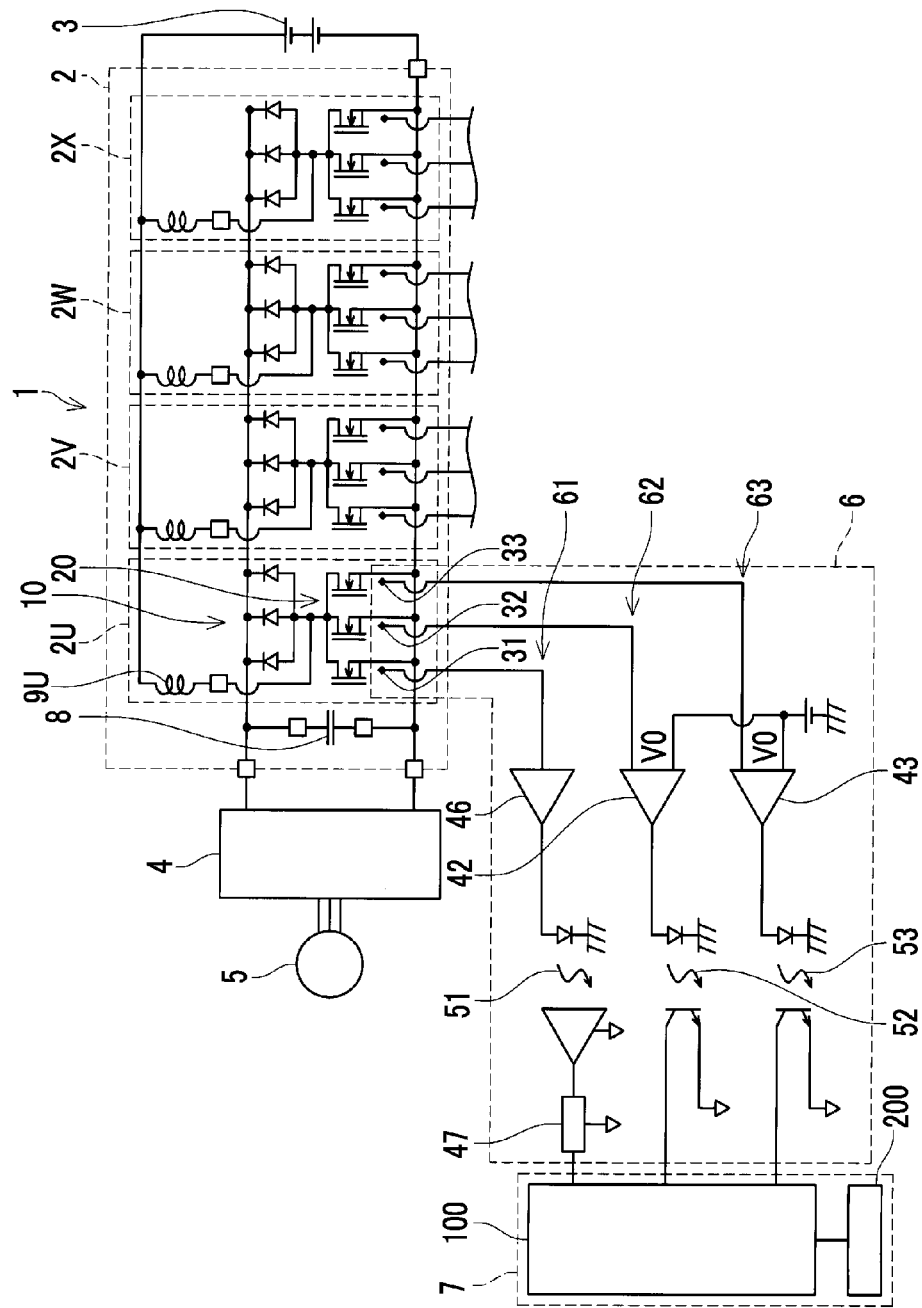
FIG. 2 is a circuit configuration diagram of the electric power conversion device according to the first example.

The configuration of the converter 2 will be described. As shown in FIG. 2, the converter 2 is a multi-phase converter, and includes four converters including a U-phase converter 2U, a V-phase converter 2V, a W-phase converter 2W, and an X-phase converter 2X. The U-phase converter 2U, the V-phase converter 2V, the W-phase converter 2W, and the X-phase converter 2X are arranged in parallel and connected in parallel with one another. The U-phase converter 2U, the V-phase converter 2V, the W-phase converter 2W, and the X-phase converter 2X have the same configuration. Accordingly, only the configuration of the U-phase converter 2U among the four converters will be described, and description of the configurations of the V-phase converter 2V, the W-phase converter 2W, and the X-phase converter 2X will be omitted. In the following description, the U-phase converter 2U, the V-phase converter 2V, the W-phase converter 2W, and the X-phase converter 2X may be referred to as "single-phase converters 2A" with no distinction from one another.

Figure 3:
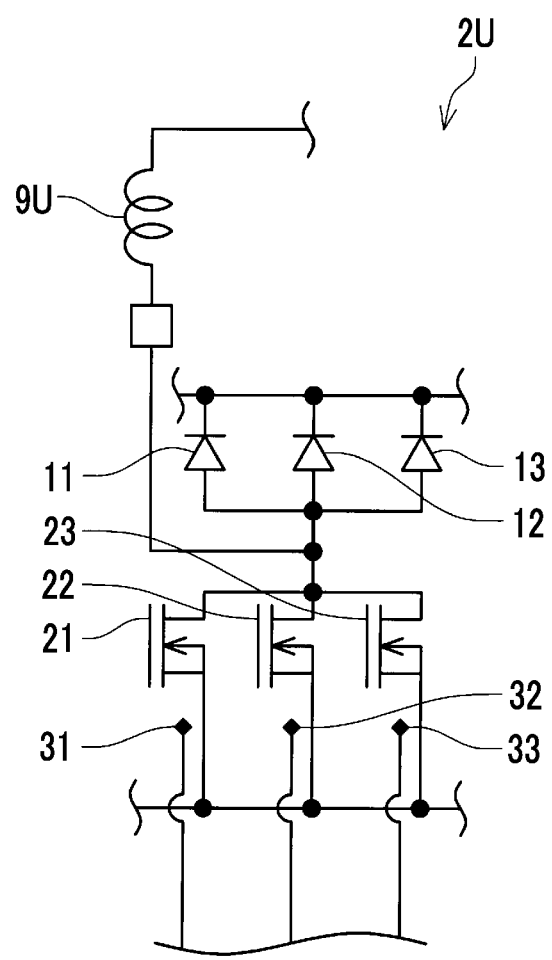
FIG. 3 is a circuit configuration diagram of a U-phase converter.

As shown in FIG. 3, the U-phase converter 2U includes one reactor 9U. The U-phase converter 2U also includes three diodes including a first diode 11, a second diode 12, and a third diode 13. The U-phase converter 2U also includes three switching elements including a first switching element 21, a second switching element 22, and a third switching element 23. The first diode 11, the second diode 12, and the third diode 13 are arranged in parallel and connected in parallel with one another. Similarly, the first switching element 21, the second switching element 22, and the third switching element 23 are arranged in parallel and connected in parallel with one another. In the following description, the first diode 11, the second diode 12, and the third diode 13 may be referred to as "diodes 10" with no distinction from one another. The first switching element 21, the second switching element 22, and the third switching element 23 may be referred to as "switching elements 20" with no distinction from one another.

One end of the reactor 9U is connected to one end of the diodes 10 and one end of the switching elements 20. As shown in FIG. 2, the other end of the reactor 9U is connected to a positive electrode of the power supply 3. The other end of the diodes 10 is connected to a positive electrode-side output terminal. The other end of the switching elements 20 is connected to a negative electrode-side output terminal and a negative electrode of the power supply 3. A capacitor 8 is arranged between the positive electrode-side output terminal and the negative electrode-side output terminal. One end of the capacitor 8 is connected to the positive electrode-side output terminal, and the other end of the capacitor 8 is connected to the negative electrode-side output terminal.

As the switching elements 20, for example, metal oxides semiconductor, field effect transistors (MOSFETs) or insulated gate bipolar transistors (IGBTs) can be used. The switching elements 20 repeatedly perform the ON/OFF operations based on a predetermined duty ratio. If the switching elements 20 repeatedly perform the ON/OFF operations, the temperatures thereof increase. If the OFF states of the switching elements 20 are continued, the temperatures thereof decrease. The temperatures of the switching elements 20 change according to the operation states of the switching elements 20. The duty ratios of the switching elements 20 are controlled to control the ON/OFF operations, whereby it is possible to control electric power output from the single-phase converters 2A.

In this example, the switching elements 21, 22, 23 which are simultaneously turned ON/OFF are connected in parallel with one another, thereby switching ON/OFF a large current. The gates of the switching elements 21, 22, 23 are connected to a common wiring.

Next, the configurations of the circuit unit 6 and the control unit 7 will be described. As shown in FIG. 2, the circuit unit 6 includes three temperature sensors including a first temperature sensor 31, a second temperature sensor 32, and a third temperature sensor 33. The circuit unit 6 includes three transmission circuits including a first transmission circuit 61, a second transmission circuit 62, and a third transmission circuit 63.

The first temperature sensor 31, the second temperature sensor 32, and the third temperature sensor 33 are arranged in parallel. In the following description, the first temperature sensor 31, the second temperature sensor 32, and the third temperature sensor 33 may be referred to as "temperature sensors 30" with no distinction from one another.

As shown in FIG. 3, the first temperature sensor 31 is arranged adjacent to the first switching element 21. The first temperature sensor 31 and the first switching element 21 are arranged in parallel. The first temperature sensor 31 detects a temperature T1 of the first switching element 21. The first temperature sensor 31 outputs a voltage corresponding to the detected temperature T1 of the first switching element 21. The voltage (the voltage corresponding to the detected temperature T1 of the first switching element 21) output from the first temperature sensor 31 is referred to as a first voltage V1 (an example of a first signal). The first temperature sensor 31 outputs the first voltage V1 as an analog signal. The analog signal is a signal whose value changes continuously.

The second temperature sensor 32 is arranged adjacent to the second switching element 22. The second temperature sensor 32 and the second switching element 22 are arranged in parallel. The second temperature sensor 32 detects a temperature T2 of the second switching element 22. The second temperature sensor 32 outputs a voltage corresponding to the detected temperature T2 of the second switching element 22. The voltage (the voltage corresponding to the detected temperature T2 of the second switching element 22) output from the second temperature sensor 32 is referred to as a second voltage V2. The second temperature sensor 32 outputs the second voltage V2 as an analog signal.

The third temperature sensor 33 is arranged adjacent to the third switching element 23. The third temperature sensor 33 and the third switching element 23 are arranged in parallel. The third temperature sensor 33 detects a temperature T3 of the third switching element 23. The third temperature sensor 33 outputs a voltage corresponding to the detected temperature T3 of the third switching element 23. The voltage (the voltage corresponding to the detected temperature T3 of the third switching element 23) output from the third temperature sensor 33 is referred to as a third voltage V3. The third temperature sensor 33 outputs the third voltage V3 as an analog signal.

As the temperature sensors 30, for example, diodes for temperature detection can be used. A diode for temperature detection is an element capable of detecting the temperature of a detection target (switching element 20) using a property that the voltage-current characteristics of the diode change depending on the temperature. If the temperature changes in a state where a given forward current flows in the diode, the forward current changes, and thus, it is possible to detect the temperature from the changed forward current.

As shown in FIG. 2, the first transmission circuit 61 is connected to the first temperature sensor 31 and a control device 100. The first transmission circuit 61 transmits a signal to the control device 100. The first transmission circuit 61 includes a modulation circuit 46, a first insulating coupler 51 and a demodulation circuit 47.

The modulation circuit 46 is electrically connected to the first temperature sensor 31. The modulation circuit 46 modulates the analog signal of the first voltage V1 output from the first temperature sensor 31 to a digital signal. The modulation circuit 46 outputs the digital signal of the first voltage V1. The digital signal is a signal whose value changes discontinuously (discretely). The digital signal of the first voltage V1 is modulated to a pulse width modulation (PWM) signal.

The first insulating coupler 51 is electrically connected to the modulation circuit 46 and the demodulation circuit 47. The first insulating coupler 51 transmits the digital signal of the first voltage V1 output from the modulation circuit 46 to the demodulation circuit 47. As the first insulating coupler 51, a photocoupler or a magnetic coupler can be used.

Figure 4:
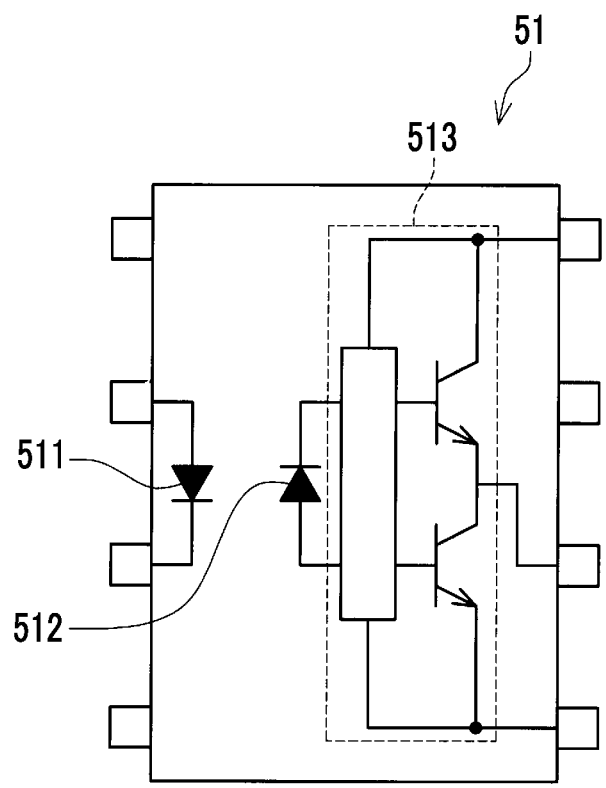
FIG. 4 is a circuit configuration diagram of a first insulating coupler.

As shown in FIG. 4, the first insulating coupler 51 includes a light emitting diode 511 as a light emitting element, a photodiode 512 as a light receiving element, and an amplification circuit 513. The light emitting diode 511 is electrically connected to the modulation circuit 46, and the amplification circuit 513 is electrically connected to the demodulation circuit 47. The amplification circuit 513 is electrically connected to the photodiode 512. Light emitted from the light emitting diode 511 is received by the photodiode 512, whereby a signal can be transmitted. A signal can be transmitted by light in a state where an input side (light emitting element side) and an output side (light receiving element side) are electrically insulated from each other. The amplification circuit 513 amplifies and outputs a signal transmitted by light. The amplification circuit 513 includes a plurality of transistors.

The first insulating coupler 51 can transmit a signal at higher speed than a second insulating coupler 52 and a third insulating coupler 53 described below. A frequency of signal transmission in the first insulating coupler 51 is higher than a frequency of signal transmission in the second insulating coupler 52 and a frequency of signal transmission in the third insulating coupler 53. The first insulating coupler 51 can transmit a signal having a frequency of about 1 MHz to 25 MHz. Transmission delay distortion in the first insulating coupler 51 is suppressed more than transmission delay distortion in the second insulating coupler 52 and the third insulating coupler 53.

The demodulation circuit 47 demodulates the digital signal of the first voltage V1 output from the first insulating coupler 51 to an analog signal. The demodulation circuit 47 is electrically connected to the control device 100. The demodulation circuit 47 outputs the demodulated analog signal of the first voltage V1. The signal of the first voltage V1 output from the demodulation circuit 47 is input to the control device 100. The digital signal may be input to the control device 100.

The second transmission circuit 62 is connected to the second temperature sensor 32 and the control device 100. The second transmission circuit 62 transmits a signal to the control device 100. The second transmission circuit 62 includes a first comparison circuit 42 and a second insulating coupler 52. A comparison circuit is not used for the first switching element, and is used only for the second switching element and the third switching element. The comparison circuit corresponding to the second switching element is referred to as a first comparison circuit, and the comparison circuit corresponding to the third switching element is referred to as a second comparison circuit.

The first comparison circuit 42 is electrically connected to the second temperature sensor 32. The first comparison circuit 42 is, for example, a comparator. The first comparison circuit 42 compares the second voltage V2 output from the second temperature sensor 32 with a predetermined reference voltage V0, and outputs a comparison result as a digital signal. The first comparison circuit 42 outputs a result indicating that the second voltage V2 is equal to or greater than the reference voltage V0 or less than the reference voltage V0. In a case where it is determined that the second voltage V2 is equal to or greater than the reference voltage V0, the first comparison circuit 42 outputs a signal of "1". In a case where it is determined that the second voltage V2 is less than the reference voltage V0, the first comparison circuit 42 outputs a signal of "0". The first comparison circuit 42 compares the second voltage V2 with the reference voltage V0, thereby comparing the temperature T2 of the second switching element 22 detected by the second temperature sensor 32 with a predetermined reference temperature T0. The temperature T2 of the second switching element 22 detected by the second temperature sensor 32 corresponds to the second voltage V2, and the reference temperature T0 corresponds to the reference voltage V0. The reference voltage V0 is set in advance, and the corresponding reference temperature T0 is also set in advance. The reference temperature T0 is, for example, set to 100° C. The reference temperature T0 is set directly below a temperature at which overheating prevention control of the switching element 20 is required.

The second insulating coupler 52 is electrically connected to the first comparison circuit 42 and the control device 100. The second insulating coupler 52 transmits the digital signal of the comparison result output from the first comparison circuit 42 to the control device 100. As the second insulating coupler 52, a photocoupler or a magnetic coupler can be used.

Figure 5:
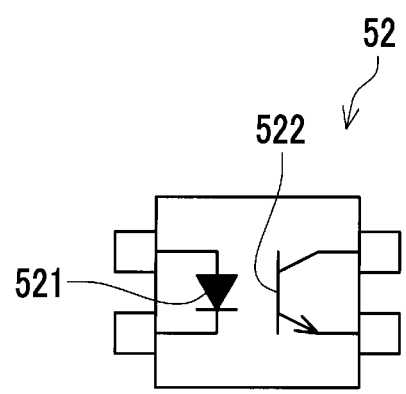
FIG. 5 is a circuit configuration diagram of a second insulating coupler.

As shown in FIG. 5, the second insulating coupler 52 includes a light emitting diode 521 as a light emitting element, and a phototransistor 522 as a light receiving element. The light emitting diode 521 is electrically connected to the first comparison circuit 42, and the phototransistor 522 is electrically connected to the control device 100. Light emitted from the light emitting diode 521 is received by the phototransistor 522, whereby a signal can be transmitted. A signal can be transmitted by light in a state where an input side (light emitting element side) and an output side (light receiving element side) are electrically insulated from each other. The second insulating coupler 52 transmits a signal at lower speed than the first insulating coupler 51 described above. The second insulating coupler 52 transmits a signal having a frequency of about 1 kHz to 9 kHz.

The third transmission circuit 63 is connected to the third temperature sensor 33 and the control device 100. The third transmission circuit 63 transmits a signal to the control device 100. The third transmission circuit 63 includes a second comparison circuit 43 and a third insulating coupler 53.

The second comparison circuit 43 is electrically connected to the third temperature sensor 33. The second comparison circuit 43 is, for example, a comparator. The second comparison circuit 43 compares the third voltage V3 output from the third temperature sensor 33 with a predetermined reference voltage V0, and outputs a comparison result as a digital signal. The second comparison circuit 43 outputs a result indicating that the third voltage V3 is equal to or greater than the reference voltage V0 or less than the reference voltage V0. In a case where the third voltage V3 is equal to or greater than the reference voltage V0, the second comparison circuit 43 outputs a signal of "1". In a case where the third voltage V3 is less than the reference voltage V0, the second comparison circuit 43 outputs a signal of "0". The second comparison circuit 43 compares the third voltage V3 with the reference voltage V0, thereby comparing the temperature T3 of the third switching element 23 detected by the third temperature sensor 33 with a predetermined reference temperature T0. The temperature T3 of the third switching element 23 detected by the third temperature sensor 33 corresponds to the third voltage V3, and the reference temperature T0 corresponds to the reference voltage V0. The reference voltage V0 of the second comparison circuit 43 is equal to the reference voltage V0 of the first comparison circuit 42.

The third insulating coupler 53 is electrically connected to the second comparison circuit 43 and the control device 100. The third insulating coupler 53 transmits the digital signal of the comparison result output from the second comparison circuit 43 to the control device 100. As the third insulating coupler 53, a photocoupler or a magnetic coupler can be used.

Figure 6:
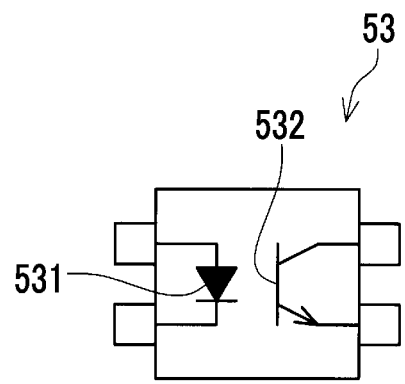
FIG. 6 is a circuit configuration diagram of a third insulating coupler.

As shown in FIG. 6, the third insulating coupler 53 includes a light emitting diode 531 as a light emitting element, and a phototransistor 532 as a light receiving element. The light emitting diode 531 is electrically connected to the second comparison circuit 43, and the phototransistor 532 is electrically connected to the control device 100. Light emitted from the light emitting diode 531 is received by the phototransistor 532, thereby a signal can be transmitted. A signal can be transmitted by light in a state where an input side (light emitting element side) and an output side (light receiving element side) are electrically insulated from each other. The third insulating coupler 53 transmits a signal at lower speed than the first insulating coupler 51 described above. The third insulating coupler 53 transmits a signal having a frequency of about 1 kHz to 9 kHz.

The modulation circuit 46, the first comparison circuit 42, the second comparison circuit 43, the first insulating coupler 51, the second insulating coupler 52, and the third insulating coupler 53 described above are arranged on a single intelligent power module (IPM).

Figure 7:
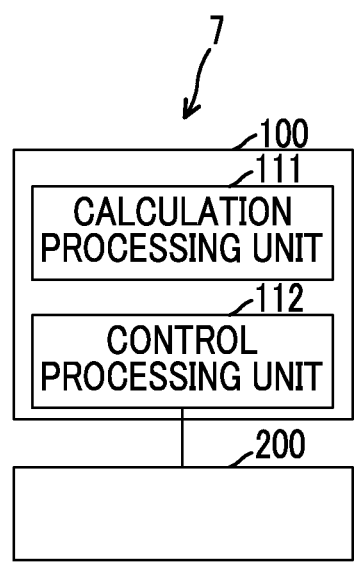
FIG. 7 is a block diagram of a control unit.
Figure 8:
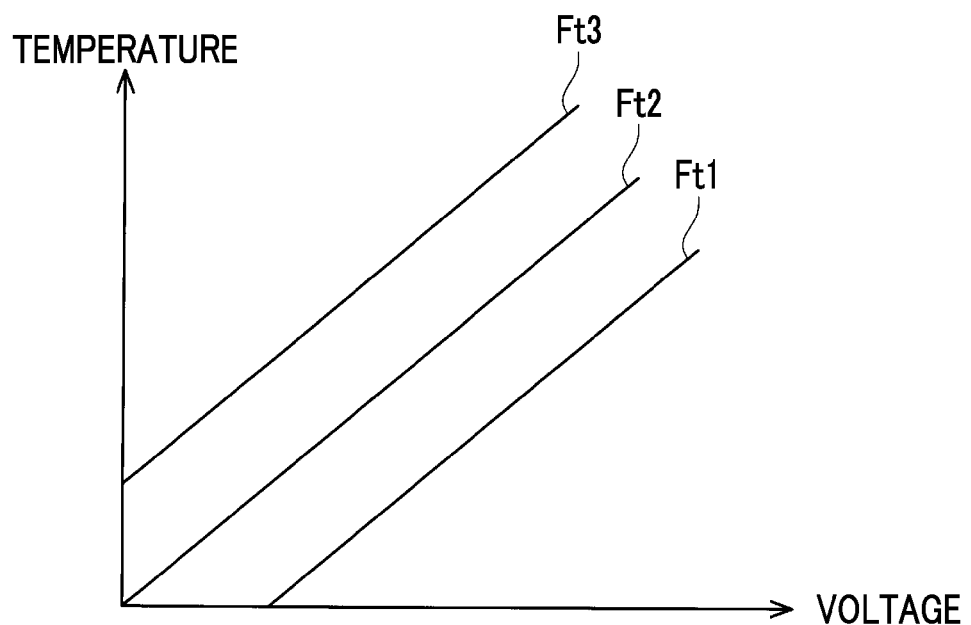
FIG. 8 is a graph showing a temperature characteristic function.

As shown in FIG. 7, the control unit 7 includes a control device 100 and a storage device 200. The storage device 200 stores various kinds of information. The storage device 200 stores a temperature characteristic function Ft and a comparison temperature Tc in advance. As the temperature characteristic function Ft, there are a first temperature characteristic function Ft1, a second temperature characteristic function Ft2, and a third temperature characteristic function Ft3. As shown in FIG. 8, in this example, the temperature characteristic function Ft (Ft1, Ft2, Ft3) is a linear function. The first temperature characteristic function Ft1, the second temperature characteristic function Ft2, and the third temperature characteristic function Ft3 have different intercepts and slopes of the linear function. In an initial state, as the temperature characteristic function Ft, the first temperature characteristic function Ft1 is stored in the storage device 200. As the comparison temperature Tc, a first comparison temperature Tc2 and a second comparison temperature Tc3 are stored in the storage device 200.

The storage device 200 stores parameters for correcting the temperature characteristic function Ft in advance. As the parameters, the slope of the temperature characteristic function Ft as a linear function is stored. For example, a slope "a1" for used in the first temperature characteristic function Ft1, a slope. "a2" for use in the second temperature characteristic function Ft2, and a slope "a3" for use in the third temperature characteristic function Ft3 are stored in the storage device 200. The slope of the temperature characteristic function Ft as a linear function is corrected by correction processing described below. For example, the slope of the temperature characteristic function Ft is corrected in an order of a1→a2→a3.

A correction amount α is added to the temperature characteristic function Ft. The correction amount α is an amount (value) obtained by adding all additional amounts ΔT in the correction processing described below. The correction amount α is an amount (value) which is added to the intercept of the temperature characteristic function Ft as a linear function. If the additional amount ΔT is added to the correction amount α by the correction processing described below, the intercept of the temperature characteristic function Ft as a linear function is increasing. The correction amount α in the first temperature characteristic function Ft1 is "0 (zero)".

As shown in FIG. 8, the temperature characteristic function Ft (Ft1, Ft2, Ft3) is a linear function indicating the relationship between a voltage and a temperature. For example, the first temperature characteristic function Ft1 can be represented as "Ft1=a1V+b+α". a1 is the slope of the linear function, and b+a corresponds to the intercept of the linear function. α is a correction amount which is added to the intercept of the temperature characteristic function Ft, and the correction amount α in the first temperature characteristic function Ft1 is "0 (zero)". A value indicating the first voltage V1 is input to V. The temperature characteristic function Ft (Ft1, Ft2, Ft3) is a function for calculating a calculated temperature Tx from the first voltage V1. If the first voltage V1 is input to the temperature characteristic function Ft (Ft1, Ft2, Ft3), the calculated temperature Tx is output. As described below, when calculating the calculated temperature Tx, calculation is performed using one of the first temperature characteristic function Ft1, the second temperature characteristic function Ft2, and the third temperature characteristic function Ft3. In a case where the same first voltage V1 is input to the first temperature characteristic function Ft1, the second temperature characteristic function Ft2, and the third temperature characteristic function. Ft3, in this example, the first temperature characteristic function Ft1 outputs the lowest calculated temperature Tx, the second temperature characteristic function Ft2 outputs the second lowest calculated temperature Tx, and the third temperature characteristic function Ft3 outputs the highest calculated temperature Tx.

The first temperature characteristic function Ft1 is set in advance. The first temperature characteristic function Ft1 corresponds to the first temperature sensor 31. When setting the first temperature characteristic function. Ft1, the relationship between the temperature T1 of the first switching element 21 detected by the first temperature sensor 31 and the corresponding first voltage V1 is examined in advance by an experiment or analysis, and the relationship between the temperature T1 and the first voltage V1 is determined. The determined relationship is referred to as the first temperature characteristic function Ft1.

The temperature characteristic function Ft is corrected from the initial first temperature characteristic function Ft1 to the second temperature characteristic function Ft2 and the third temperature characteristic function Ft3. In this example, the temperature characteristic function Ft is corrected in an order of Ft1→Ft2→Ft3. The slope and the intercept of the temperature characteristic function Ft are corrected by the correction processing described below.

The slope "a2" of the second temperature characteristic function Ft2 is set in advance. The slope "a2" of the second temperature characteristic function Ft2 corresponds to the second temperature sensor 32. When setting the slope "a2" of the second temperature characteristic function Ft2, the relationship between the temperature T2 of the second switching element 22 detected by the second temperature sensor 32 and the corresponding second voltage V2 is examined in advance by an experiment or analysis, and the relationship between the temperature T2 and the second voltage V2 is determined. The slope "a2" of the second temperature characteristic function Ft2 is set based on the determined relationship.

Similarly, the slope "a3" of the third temperature characteristic function Ft3 is set in advance. The slope "a3" of the third temperature characteristic function Ft3 corresponds to the third temperature sensor 33. When setting the slope "a3" of the third temperature characteristic function Ft3, the relationship between the temperature T3 of the third switching element 23 detected by the third temperature sensor 33 and the corresponding third voltage V3 is examined in advance by an experiment or analysis, and the relationship between the temperature T3 and the third voltage V3 is determined. The slope "a3" of the third temperature characteristic function Ft3 is set based on the determined relationship.

FIG. 8 illustrates a case where the relationship of the output voltage V1 of the first temperature sensor 31>the output voltage V2 of the second temperature sensor 32>the output voltage V3 of the third temperature sensor 33 is established at the same temperature, and illustrates a case where the relationship of the detected temperature T1 of the first switching element 21<the detected temperature T2 of the second switching element 22<the detected temperature T3 of the third switching element 23 is established at the same output voltage.

The comparison temperature Tc stored in the storage device 200 is a temperature for comparison with the calculated temperature Tx. The first comparison temperature Tc2 corresponds to the temperature T2 of the second switching element 22 detected by the second temperature sensor 32. The second comparison temperature Tc3 corresponds to the temperature T3 of the third switching element 23 detected by the third temperature sensor 33. The first comparison temperature Tc2 and the second comparison temperature Tc3 are different temperatures. For example, the first comparison temperature Tc2 is 102° C., and the second comparison temperature Tc3 is 105° C.

The first comparison temperature Tc2 is set in advance based on the following thinking. That is, in the electric power conversion device 1 having the above-described configuration, when focusing on the actual temperature of the second switching element 22 when the first comparison circuit 42 outputs the signal of "1" as the comparison result, there is an error between a temperature in design and the actual temperature. Such an error occurs primarily due to product errors of the second temperature sensor 32 and the first comparison circuit 42. For example, even if the reference temperature T0 in design is set to 100° C., and the first comparison circuit 42 is configured to output the signal of "1" in design if the temperature of the second switching element 22 becomes equal to or higher than 100° C., actually, a product may be made in which, while the temperature of the second switching element 22 becomes equal to or higher than the 100° C., the first comparison circuit 42 does not output the signal of "1", and when the temperature of the second switching element 22 becomes equal to or higher than 102° C., the first comparison circuit 42 outputs the signal of "1" due to the product errors. Accordingly, the temperature of the second switching element 22 when the first comparison circuit 42 outputs the signal of the comparison result "1" is determined in advance by an experiment, and this temperature (in a case illustrated above, 102° C.) is stored in advance in the storage device 200 as the first comparison temperature Tc2. That is, the actual temperature (102° C.) of the second switching element 22 when the comparison result "1" indicating that the temperature T2 of the second switching element 22 detected by the second temperature sensor 32 becomes equal to or higher than a predetermined reference temperature T0 in design is output from the first comparison circuit 42 is determined in advance by an experiment, and this temperature (102° C.) is stored in advance in the storage device 200 as the first comparison temperature Tc2.

Similarly, the second comparison temperature Tc3 is set in advance based on the following thinking. That is, in the electric power conversion device 1 having the above-described configuration, when focusing the temperature of the third switching element 23 when the second comparison circuit 43 outputs the signal of "1" as the comparison result, there is an error between a temperature in design and the actual temperature. Such an error occurs primarily due to product errors of the third temperature sensor 33 and the second comparison circuit 43. For example, even if the reference temperature T0 in design is set to 100° C., and the second comparison circuit 43 is configured to output the signal of "1" in design if the temperature of the third switching element 23 becomes equal to or higher than 100° C., actually, a product may be made in which, while the temperature of the third switching element 23 becomes equal to or higher than 100° C., the second comparison circuit 43 does not output the signal of "1", and when the temperature of the third switching element 23 becomes equal to or higher than 105° C., the second comparison circuit 43 outputs the signal of "1" due to the product errors. Accordingly, the temperature of the third switching element 23 when the second comparison circuit 43 outputs the signal of "1" as the comparison result is determined in advance, and this temperature (in a case illustrated above, 105° C.) is stored in advance in the storage device 200 as the second comparison temperature Tc3. That is, the actual temperature (105° C.) of the third switching element 23 when the comparison result "1" indicating that the temperature T3 of the third switching element 23 detected by the third temperature sensor 33 becomes equal to or higher than a predetermined reference temperature T0 is output from the second comparison circuit 43 is determined in advance by an experiment, and this temperature (105° C.) is stored in advance in the storage device 200 as the second comparison temperature Tc3.

As shown in FIG. 7, the control device 100 includes a calculation processing unit 111 and a control processing unit 112. The control device 100 includes a central processing unit, and performs calculation processing and control processing using the central processing unit. As described below, the calculation processing unit 111 calculates the calculated temperature Tx from the first voltage V1. The calculation processing unit 111 corrects the calculated temperature Tx as necessary. The control processing unit 112 controls the operations of the first switching element 21, the second switching element 22, and the third switching element 23. The control by the control device 100 will be described below in detail.

Next, the operation of the electric power conversion device will be described. In the electric power conversion device 1 including the above-described configuration, the switching elements 20 of the converter 2 repeatedly perform the ON/OFF operations to boost a voltage, and the motor 5 is rotated with the boosted voltage. The switching elements 20 repeatedly perform the ON/OFF operations to gradually increase in temperature. The temperature of each of the first switching element 21, the second switching element 22, and the third switching element 23 is increasing.

The temperatures of the switching elements 20 are detected, by the temperature sensors 30. The temperature of the first switching element 21 is detected by the first temperature sensor 31, the temperature of the second switching element 22 is detected by the second temperature sensor 32, and the temperature of the third switching element 23 is detected by the third temperature sensor 33.

The first temperature sensor 31 outputs a voltage corresponding to the detected temperature of the first switching element 21. The voltage output from the first temperature sensor 31 is referred to as the first voltage V1. In a case where the temperature of the first switching element 21 is high, the high-voltage first voltage V1 is output, and in a case where the temperature of the first switching element 21 is low, the low-voltage first voltage V1 is output. The first voltage V1 output from the first temperature sensor 31 is output as an analog signal.

Similarly to the first temperature sensor 31, the second temperature sensor 32 outputs a voltage corresponding to the detected temperature of the second switching element 22. The voltage output from the second temperature sensor 32 is referred to as the second voltage V2. In a case where the temperature of the second switching element 22 is high, the high-voltage second voltage V2 is output, and in a case where the temperature of the second switching element 22 is low, the low-voltage second voltage V2 is output. The second voltage V2 output from the second temperature sensor 32 is output as an analog signal.

Similarly, the third temperature sensor 33 outputs a voltage corresponding to the detected temperature of the third switching element 23. The voltage output from the third temperature sensor 33 is referred to as the third voltage V3. In a case where the temperature of the third switching element 23 is high, the high-voltage third voltage V3 is output, and in a case where the temperature of the third switching element 23 is low, the low-voltage third voltage V3 is output. The third voltage V3 output from the third temperature sensor 33 is output as an analog signal.

The first voltage V1 output from the first temperature sensor 31 is input to the modulation circuit 46. The first voltage V1 is input to the modulation circuit 46 as an analog signal. The modulation circuit 46 modulates the input analog signal of the first voltage V1 to a digital signal by PWM. The modulation circuit 46 outputs the first voltage V1 as a digital signal. The first voltage V1 output from the modulation circuit 46 is input to the first insulating coupler 51.

The first insulating coupler 51 outputs the first voltage V1 input from the modulation circuit 46 to the demodulation circuit 47. The first insulating coupler 51 transmits the digital signal of the first voltage V1 in a state where an input side (modulation circuit 46 side) and an output side (demodulation circuit 47 side) are electrically insulated from each other. The first voltage V1 output from the first insulating coupler 51 is input to the demodulation circuit 47.

The demodulation circuit 47 modulates the input digital signal of the first voltage V1 to an analog signal. The demodulation circuit 47 outputs the first voltage V1 as an analog signal. The first voltage V1 output from the demodulation circuit 47 is input to the control device 100.

The second voltage V2 output from the second temperature sensor 32 is input to the first comparison circuit 42. The second voltage V2 is input to the first comparison circuit 42 as an analog signal. The first comparison circuit 42 compares the input second voltage V2 with a predetermined reference voltage V0. The first comparison circuit 42 outputs a comparison result of the second voltage V2 and the reference voltage V0 as a digital signal. The comparison result by the first comparison circuit 42 is referred to as a first comparison result C2. The first comparison circuit 42 outputs the first comparison result C2 as a digital signal of "0" in a case where it is determined that the second voltage V2 is less than the predetermined reference voltage V0. In a case where it is determined that the second voltage V2 is equal to or greater than the predetermined reference voltage V0, the first comparison circuit 42 outputs the first comparison result C2 as a digital signal of "1".

The above-described second voltage V2 corresponds to the temperature T2 of the second switching element 22 detected by the second temperature sensor 32. The predetermined reference voltage V0 corresponds to the predetermined reference temperature T0. Accordingly, the first comparison circuit 42 compares the second voltage V2 with the predetermined reference voltage V0, thereby comparing the temperature T2 of the second switching element 22 detected by the second temperature sensor 32 with the predetermined reference temperature T0. Therefore, the first comparison circuit 42 outputs the first comparison result C2 as a digital signal of "0" in a case where it is determined that the temperature T2 of the second switching element 22 detected by the second temperature sensor 32 is lower than the predetermined reference temperature T0. The actual temperature of the second switching element 22 when the first comparison circuit 42 determines that the detected temperature T2 of the second switching element 22 is lower than the predetermined reference temperature T0 is lower than the first comparison temperature Tc2. Therefore, the first comparison circuit 42 outputs the first comparison result C2 as the digital signal of "0" in a case where the actual temperature of the second switching element 22 is lower than the first comparison temperature Tc2 (in a case where it is determined on a circuit that the detected temperature T2 of the second switching element 22 is lower than the reference temperature T0 in design). In a case where it is determined that the temperature T2 of the second switching element 22 detected by the second temperature sensor 32 is equal to or higher than the predetermined reference temperature T0, the first comparison circuit 42 outputs the first comparison result C2 as the digital signal of "1". The actual temperature of the second switching element 22 when the first comparison circuit 42 determines that the detected temperature T2 of the second switching element 22 is equal to or higher than the predetermined reference temperature T0 is equal to or higher than the first comparison temperature Tc2. Therefore, in a case where the actual temperature of the second switching element 22 is equal to or higher than the first comparison temperature Tc2 (in a case where it is determined on a circuit that the detected temperature T2 of the second switching element 22 is equal to or higher than the reference temperature T0 in design), the first comparison circuit 42 outputs the first comparison result C2 as the digital signal of "1". The temperature of the second switching element 22 is gradually increasing, and when the second voltage V2 (the detected temperature T2 of the second switching element 22) becomes equal to or greater than the reference voltage V0 (the reference temperature T0), the first comparison result C2 changes from "0" to "1". That is, when the actual temperature of the second switching element 22 becomes equal to or higher than the first comparison temperature Tc2, the first comparison result C2 changes from "0" to "1". The first comparison result C2 ("0" or "1") output from the first comparison circuit 42 is input to the second insulating coupler 52.

The second insulating coupler 52 outputs the first comparison result C2 ("0" or "1") input from the first comparison circuit 42 to the control device 100. The second insulating coupler 52 transmits the digital signal of the first comparison result C2 ("0" or "1") in a state where an input side (first comparison circuit 42 side) and an output side (control device 100 side) are electrically insulated from each other. The first comparison result C2 output from the second insulating coupler 52 is input to the control device 100.

The third voltage V3 output from the third temperature sensor 33 is input to the second comparison circuit 43. The third voltage V3 is input to the second comparison circuit 43 as an analog signal. The second comparison circuit 43 compares the input third voltage V3 with the predetermined reference voltage V0. The second comparison circuit 43 outputs a comparison result of the third voltage V3 and the reference voltage V0 as a digital signal. The comparison result by the second comparison circuit 43 is referred to as a second comparison result C3. In a case where it is determined that the third voltage V3 is less than the predetermined reference voltage V0, the second comparison circuit 43 outputs the second comparison result C3 as a digital signal of "0". In a case where it is determined that third voltage V3 is equal to or greater than the predetermined reference voltage V0, the second comparison circuit 43 outputs the second comparison result C3 as a digital signal of "1".

The above-described third voltage V3 corresponds to the temperature T3 of the third switching element 23 detected by the third temperature sensor 33. The predetermined reference voltage V0 corresponds to the predetermined reference temperature T0. Accordingly, the second comparison circuit 43 compares the third voltage V3 with the predetermined reference voltage V0, thereby comparing the temperature T3 of the third switching element 23 detected by the third temperature sensor 33 with the predetermined reference temperature T0. Therefore, in a case where it is determined that the temperature T3 of the third switching element 23 detected by the third temperature sensor 33 is lower than the predetermined reference temperature T0, the second comparison circuit 43 outputs the second comparison result C3 as the digital signal of "0". The actual temperature of the third switching element 23 when the second comparison circuit 43 determines that the detected temperature T3 of the third switching element 23 is lower than the predetermined reference temperature T0 is lower than the second comparison temperature Tc3. Therefore, in a case where the actual temperature of the third switching element 23 is lower than the second comparison temperature Tc3 (in a case where it is determined on a circuit that the detected temperature T3 of the third switching element 23 is lower than the reference temperature T0 in design), the second comparison circuit 43 outputs the second comparison result C3 as the digital signal of "0". In a case where it is determined that the temperature T3 of the third switching element 23 detected by the third temperature sensor 33 is equal to or higher than the predetermined reference temperature T0, the second comparison circuit 43 outputs the second comparison result C3 as the digital signal of "1". The actual temperature of the third switching element 23 when the second comparison circuit 43 determines that the detected temperature T3 of the third switching element 23 is equal to or higher than the predetermined reference temperature T0 is equal to or higher than the second comparison temperature Tc3. Therefore, in a case where the actual temperature of the third switching element 23 is equal to or higher than the second comparison temperature Tc3 (in a case where it is determined on a circuit that the detected temperature T3 of the third switching element 23 is equal to or higher than the reference temperature T0 in design), the second comparison circuit 43 outputs the second comparison result C3 as the digital signal of "1". The temperature of the third switching element 23 is gradually increasing, and when the third voltage V3 (the detected temperature T3 of the third switching element 23) becomes equal to or greater than the reference voltage V0 (the reference temperature T0), the second comparison result C3 changes from "0" to "1". That is, when the actual temperature of the third switching element 23 becomes equal to or higher than the second comparison temperature Tc3, the second comparison result C3 changes from "0" to "1". The second comparison result C3 ("0" or "1") output from the second comparison circuit 43 is input to the third insulating coupler 53.

The third insulating coupler 53 outputs the second comparison result C3 ("0" or "1") input from the second comparison circuit 43 to the control device 100. The third insulating coupler 53 transmits the digital-signal of the second comparison result C3 ("0" or "1") in a state where an input side (second comparison circuit 43 side) and an output side (control device 100 side) are electrically insulated from each other. The second comparison result C3 output from the third insulating coupler 53 is input to the control device 100.

Next, the operation of the control device 100 will be described. The control device 100 executes processing according to the following procedure. As described above, the analog signal of the first voltage V1 is input to the control device 100 by the first transmission circuit 61. Furthermore, the digital signal of the first comparison result C2 is input to the control device 100 by the second transmission circuit 62, and the digital signal of the second comparison result C3 is input to the control device 100 by the third transmission circuit 63. The calculation processing unit 111 of the control device 100 calculates the calculated temperature Tx based on these signals. The calculation processing unit 111 corrects the calculated temperature Tx. The control processing unit 112 of the control device 100 controls the operations of the switching elements 20 based on the calculated temperature Tx. These kinds of processing will be described below in detail.

Figure 9:
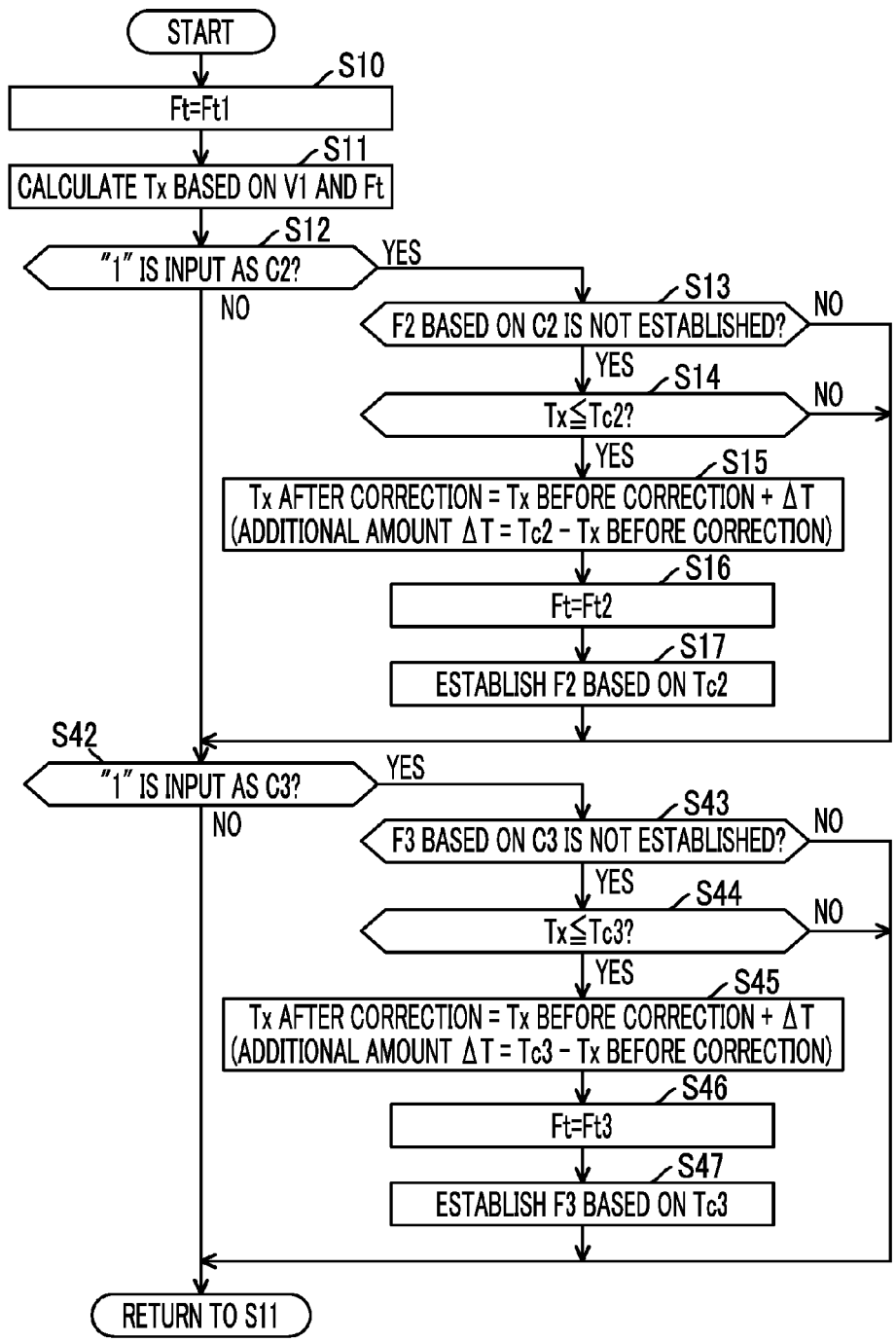
FIG. 9 is a flowchart of processing according to the first example which is executed by the control device.
Figure 10:
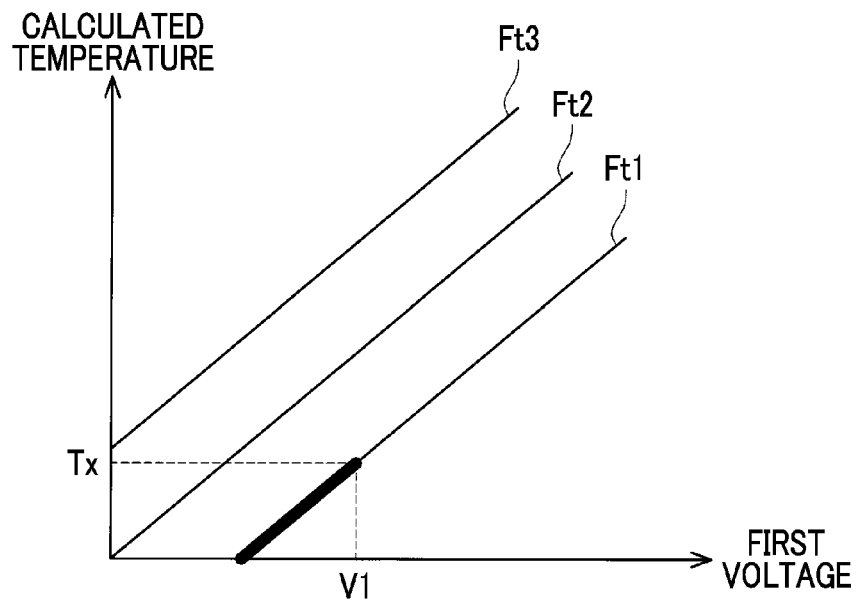
FIG. 10 is a graph showing the relationship between a first voltage and a calculated temperature.

As shown in FIG. 9, first, in S10, the control device 100 sets the first temperature characteristic function Ft1 as the temperature characteristic function Ft. Next, in S11, the calculation processing unit 111 of the control device 100 calculates the calculated temperature Tx based on the first voltage V1 and the first temperature characteristic function Ft1. The correction amount α is added to the temperature characteristic function Ft. The correction amount α which is added to the first temperature characteristic function Ft1 is "0 (zero)". The first voltage V1 is input from the demodulation circuit 47 to the control device 100. The first temperature characteristic function Ft1 is stored in the storage device 200. As shown in FIG. 10, the calculated temperature Tx is calculated from the first voltage V1 using the first temperature characteristic function Ft1. The calculated temperature Tx calculated by the calculation processing unit 111 using the first temperature characteristic function Ft1 is a temperature to which the correction processing is not performed even once. The control device 100 recognizes the calculated temperature Tx as the temperature of the switching element 20.

While the first voltage V1 is input from the demodulation circuit 47 to the control device 100, the first comparison result C2 is input from the second insulating coupler 52 to the control device 100, and the second comparison result C3 is input from the third insulating coupler 53 to the control device 100.

In S12 subsequent to S11, the calculation processing unit 111 determines whether or not the first comparison result C2 of "1" is input from the second insulating coupler 52. As described above, in a case where it is determined in the first comparison circuit 42 that the second voltage V2 (the detected temperature T2 of the second switching element 22) is less than the predetermined reference voltage V0 (the reference temperature T0 in design), the first comparison result C2 of "0" is input to the control device 100. That is, in a case where it is determined that the actual temperature of the detected temperature T2 of the second switching element 22 is lower than the first comparison temperature Tc2, the first comparison result C2 of "0" is input to the control device 100. In a case where it is determined in the first comparison circuit 42 that the second voltage V2 (the detected temperature T2 of the second switching element 22) becomes equal to or greater than the predetermined reference voltage V0 (the reference temperature T0 in design), the first comparison result C2 of "1" is input to the control device 100. That is, in a case where the it is determined the actual temperature of the detected temperature T2 of the second switching element 22 is equal to or higher than the first comparison temperature Tc2, the first comparison result C2 of "1" is input to the control device 100. The calculation processing unit 111 determines whether or not the input first comparison result C2 changes from "0" to "1". If the first comparison result C2 input to the control device 100 changes from "0" to "1", the calculation processing unit 111 determines to be yes at this time and progresses to S13. In a case where the first comparison result C2 of "1" is not input to the control device 100 (in a case where the first comparison result C2 of "0" is input), the calculation processing unit 111 skips S13 to S17 and progresses the process to S42. That is, in a case where the first comparison result C2 input to the control device 100 does not change from "0" to "1" (in a case where the state of "0" is maintained), the calculation processing unit 111 determines to be no and progresses to S42.

Next, in S13, the calculation processing unit 111 determines whether or not a second correction completion flag F2 based on the first comparison result C2 is set. The second correction completion flag F2 is information indicating that the correction processing of the calculated temperature Tx is completed. In a case where the second correction completion flag F2 is not set, the calculation processing unit 111 determines to be yes in S13 and progresses to S14. In a case where the second correction completion flag F2 is set, the calculation processing unit 111 determines to be no, skips S14 to S17, and progresses to S42.

Next, in S14, the calculation processing unit 111 compares the calculated temperature Tx calculated in S11 described above with the first comparison temperature Tc2. The first comparison temperature Tc2 is stored in the storage device 200. In a case where the calculated temperature Tx is lower than the first comparison temperature Tc2, the calculation processing unit 111 determines to be yes in S14 and progresses to S15. In a case where the calculated temperature Tx is equal to or higher than the first comparison temperature Tc2, the calculation processing unit 111 determines to be no, skips S15 to S17, and progresses to S42.

Figure 11:
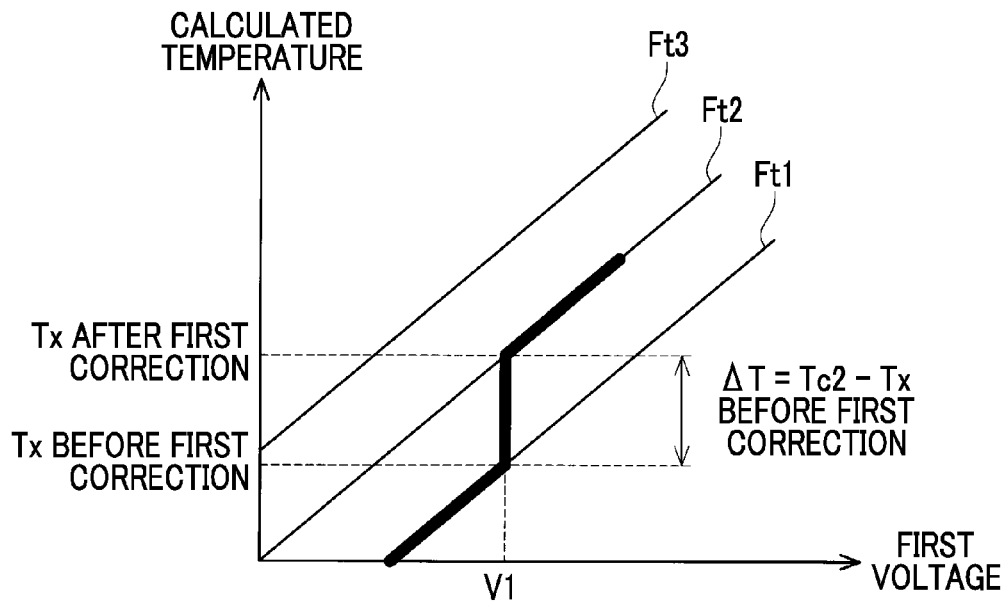
FIG. 11 is a graph showing the relationship between the first voltage and the calculated temperature.

Next, in S15, the calculation processing unit 111 corrects the calculated temperature Tx calculated in S11. The calculation processing unit 111 executes first correction processing. Specifically, the calculation processing unit 111 calculates a first additional amount ΔT based on the calculated temperature Tx before first correction and the first comparison temperature Tc2. The additional amount ΔT is the difference between the first comparison temperature Tc2 and the calculated temperature Tx before the first correction. That is, the additional amount ΔT=Tc2−Tx before the first correction. As shown in FIG. 11, the calculation processing unit 111 sets the temperature obtained by adding the additional amount ΔT to the calculated temperature Tx before the first correction as the calculated temperature Tx after the first correction. That is, Tx after the first correction=Tx before the first correction+ΔT. The control device 100 recognizes the calculated temperature Tx after the first correction as the temperature of the switching element 20.

In subsequent S16, the calculation processing unit 111 corrects the temperature characteristic function Ft from the first temperature characteristic function Ft1 to the second temperature characteristic function Ft2. Specifically, the calculation processing unit 111 corrects the slope of the temperature characteristic function Ft from a1 for the first temperature characteristic function Ft1 to a2 for the second temperature characteristic function Ft2. The calculation processing unit 111 adds the first additional amount ΔT calculated above to the correction amount α of the temperature characteristic function Ft. That is, the additional amount ΔT is added to the intercept of the temperature characteristic function Ft. The calculation processing unit 111 uses the second temperature characteristic function Ft2 as a future temperature characteristic function Ft. In subsequent S17, the calculation processing unit 111 sets the second correction completion flag F2 based on the first comparison result C2.

In the following description, it is assumed that the second temperature characteristic function Ft2 is set as the temperature characteristic function Ft. In S11, the calculation processing unit 111 of the control device 100 calculates the calculated temperature Tx based on the first voltage V1 and the second temperature characteristic function Ft2. The calculated temperature Tx calculated by the calculation processing unit 111 using the second temperature characteristic function Ft2 is a temperature reflecting the above-described first correction, but is a temperature not subjected to second or subsequent correction processing. In S12 subsequent to S11 in a case where the determination is yes, the process progresses to S13 and in a case where the determination is no, the process progresses to S42. In S13, since the second correction completion flag F2 is set, the calculation processing unit 111 determines to be no, and progresses to S42.

In S42, the calculation processing unit III determines whether or not the second comparison result C3 of "1" is input from the third insulating coupler 53. As described above, in a case where it is determined in the second comparison circuit 43 that the third voltage V3 (the detected temperature T3 of the third switching element) is less than the predetermined reference voltage V0 (the reference temperature T0 in design), the second comparison result C3 of "0" is input to the control device 100. That is, in a case where it is determined that the actual temperature of the detected temperature T3 of the third switching element 23 is lower than the second comparison temperature Tc3, the second comparison result C3 of "0" is input to the control device 100. In a case where it is determined in the second comparison circuit 43 that the third voltage V3 (the detected temperature T3 of the third switching element) becomes equal to or greater than the predetermined reference voltage V0 (the reference temperature T0 in design), the second comparison result C3 of "1" is input to the control device 100. That is, in a case where it is determined that the actual temperature of the detected temperature T3 of the third switching element 23 is equal to or higher than the second comparison temperature Tc3, the second comparison result C3 of "1" is input to the control device 100. The calculation processing unit 111 determines whether or not the input second comparison result C3 changes from "0" to "1". If the second comparison result C3 input to the control device 100 changes from "0" to "1", the calculation processing unit 111 determines to be yes at this time and progresses to S43. In a case where the second comparison result C3 of "I" is not input to the control device 100 (in a case where the second comparison result C3 of "0" is input), the calculation processing unit 111 skips S43 to S47 and returns to S11. That is, in a case where the second comparison result C3 input to the control device 100 does not change from "0" to "I" (in a case where the state of "0" is maintained), the calculation processing unit 111 determines to be no and returns to S11.

In S43, the calculation processing unit 111 determines whether or not a third correction completion flag F3 based on the second comparison result C3 is set. The third correction completion flag F3 is information indicating that the correction processing of the calculated temperature Tx is completed. In a case where the third correction completion flag F3 is not set, the calculation processing unit 111 determines to be yes in S43 and progresses to S44. In a case where the third correction completion flag F3 is set, the calculation processing unit 111 determines to be no, skips S44 to S47, and returns to 511.

Next, in S44, the calculation processing unit 111 compares the calculated temperature Tx calculated in S11 described above with the second comparison temperature Tc3. In a case where the temperature characteristic function Ft is corrected to the second temperature characteristic function Ft2, the calculated temperature Tx is a temperature calculated based on the first voltage V1 and the second temperature characteristic function Ft2. The second comparison temperature Tc3 is stored in the storage device 200. In a case where the calculated temperature Tx is lower than the second comparison temperature Tc3, the calculation processing unit 111 determines to be yes in S44 and progresses to S45. In a case where the calculated temperature Tx is equal to or higher than the second comparison temperature Tc3, the control device 100 determines to be no, skips S45 to S47, and returns to S11.

Figure 12:
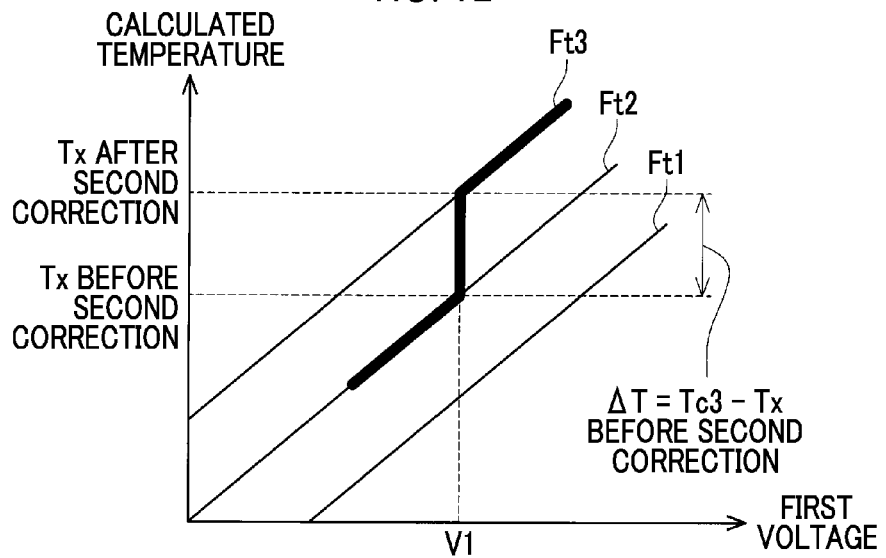
FIG. 12 is a graph showing the relationship between the first voltage and the calculated temperature.

Next, in S45, the calculation processing unit 111 corrects the calculated temperature Tx calculated in S11 described above. The calculation processing unit 111 executes second correction processing. Specifically, the calculation processing unit 111 calculates a second additional amount ΔT based on the calculated temperature Tx before second correction and the second comparison temperature Tc3. The additional amount ΔT is the difference between the second comparison temperature Tc3 and the calculated temperature Tx before the second correction. That is, the additional amount ΔT=Tc3−Tx before the second correction. As shown in FIG. 12, the calculation processing unit 111 sets a temperature obtained by adding the additional amount ΔT to the calculated temperature Tx before the second correction as the calculated temperature Tx after the second correction. That is, Tx after the second correction=Tx before the second correction+ΔT. The control device 100 recognizes the calculated temperature Tx after the second correction as the temperature of the switching element 20.

In subsequent S46, the calculation processing unit 111 corrects the temperature characteristic function Ft from the second temperature characteristic function Ft2 to the third temperature characteristic function Ft3. Specifically, the calculation processing unit 111 corrects the slope of the temperature characteristic function Ft from a2 for the second temperature characteristic function Ft2 to a3 for the third temperature characteristic function Ft3. The calculation processing unit 111 adds the second additional amount ΔT calculated above to the correction amount α of the temperature characteristic function Ft. That is, the additional amount ΔT is added to the intercept of the temperature characteristic function Ft. The calculation processing unit 111 uses the third temperature characteristic function Ft3 as a future temperature characteristic function Ft. In subsequent S47, the calculation processing unit III sets the third correction completion flag F3 based on the second comparison result C3.

If the above-described processing ends, the calculation processing unit Ill returns to S11. In S11 the calculation processing unit 111 calculates the calculated temperature Tx based on the first voltage V1 and the temperature characteristic function Ft if the correction processing is not performed even once. In a case where the temperature characteristic function Ft is corrected to the second temperature characteristic function Ft2, the second temperature characteristic function Ft2 is used. In a case where the temperature characteristic function Ft is corrected to the third temperature characteristic function Ft3, the third temperature characteristic function Ft3 is used. The calculation processing unit 111 of the control device 100 repeatedly performs the above-described processing. In this way, learning is performed.

The processing of FIG. 9 is processing in a case where the three switching elements are connected in parallel with one another. In a case where two switching elements are connected in parallel with each other, the processing of S42 to S47 is not required. In a case where two switching elements are connected in parallel with each other, a technique described in claim 1 can be used as it is.

Figure 13:
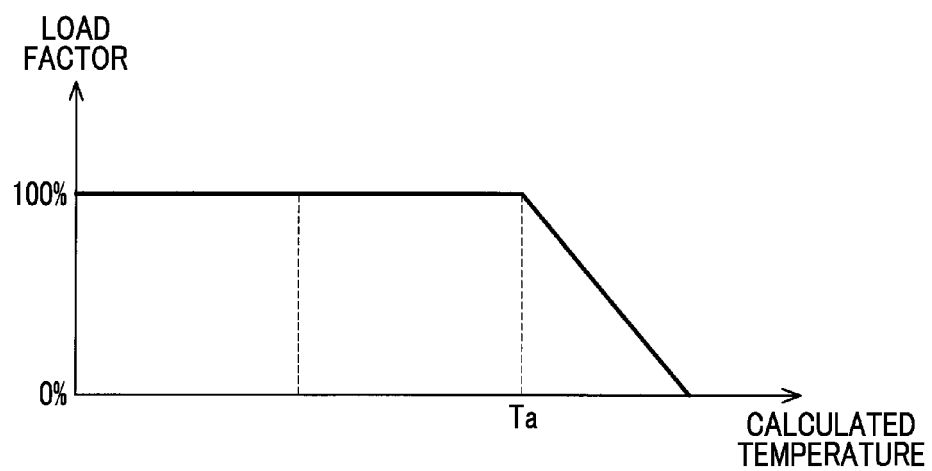
FIG. 13 is a graph showing the relationship between the calculated temperature and a load factor.

The control processing unit 112 of the control device 100 limits the operations of the switching elements 20 based on the calculated temperature Tx calculated by the calculation processing unit 111. In a case where the above-described correction processing is performed, the operations of the switching elements 20 are limited based on the calculated temperature Tx reflecting the correction processing. Specifically, if the calculated temperature Tx becomes equal to or higher than a predetermined limit temperature Ta, the control processing unit 112 limits the operations of the first switching element 21, the second switching element 22, and the third switching element 23. The control processing unit 112 limits the operations of the switching elements 20 so as to decrease electric power output from the electric power conversion device 1. That is, as shown in FIG. 13, in a case where the calculated temperature Tx is equal to or higher than the predetermined limit temperature Ta, the control processing unit 112 limits the load factors of the switching elements 20. With this, the load factor of the electric power conversion device 1 is limited. The limit temperature Ta is a temperature higher than the first comparison temperature Tc2 and the second comparison temperature Tc3.

In the above-described electric power conversion device 1, if the motor 5 for vehicle traveling decreases in speed, the temperatures of the switching elements 20 are decreasing accordingly. The temperature of each of the first switching element 21, the second switching element 22, and the third switching element 23 is decreasing. If the temperature of the first switching element 21 is decreasing, the first voltage V1 corresponding to this temperature is decreasing. If the first voltage V1 decreases, the calculated temperature Tx calculated based on the first voltage V1 and the temperature characteristic function Ft decreases.

The calculation processing unit 111 of the control device 100 resets the above-described correction if the calculated temperature Tx reflecting the above-described correction processing becomes lower than a predetermined reset temperature Tb. Specifically, in a case where the calculated temperature Tx is lower than the reset temperature Tb, the calculation processing unit 111 returns the temperature characteristic function Ft to the first temperature characteristic function Ft1. The calculation processing unit 111 resets the correction amount α in the temperature characteristic function Ft to 0 (zero). The calculation processing unit 111 resets the second correction completion flag F2 and the third correction completion flag F3. With this, the initial state is returned. The reset temperature Tb is a temperature lower than the first comparison temperature Tc2 and the second comparison temperature Tc3.

As will be apparent from the above description, the electric power conversion device 1 according to the first example includes the first transmission circuit 61 which transmits the first voltage V1 (an example of a first signal) indicating the temperature T1 of the first switching element 21 detected by the first temperature sensor 31 to the control device 100. The electric power conversion device 1 also includes the second transmission circuit 62 which compares the second voltage V2 indicating the temperature T2 of the second switching element 22 detected by the second temperature sensor 32 with the predetermined reference voltage V0 by the first comparison circuit 42, and transmits, to the control device 100, the first comparison result C2 indicating that the detected temperature T2 of the second switching element 22 becomes equal to or higher than the reference temperature T0. That is, the second transmission circuit 62 transmits, to the control device 100, the first comparison result C2 indicating that the actual temperature of the second switching element 22 becomes equal to or higher than the first comparison temperature Tc2. The electric power conversion device 1 also includes the third transmission circuit 63 which compares the third voltage V3 indicating the temperature T3 of the third switching element 23 detected by the third temperature sensor 33 with the predetermined reference voltage V0 by the second comparison circuit 43, and transmits, to the control device 100, the second comparison result C3 indicating that the detected temperature T3 of the third switching element 23 becomes equal to or higher than the reference temperature T0. That is, the third transmission circuit 63 transmits, to the control device 100, the second comparison result C3 indicating that the actual temperature of the third switching element 23 becomes equal to or higher than the second comparison temperature Tc3. The calculation processing unit 111 of the control device 100 compares the calculated temperature Tx before the first correction with the first comparison temperature Tc2 when a state where the first comparison result C2 of "1" indicating that the detected temperature T2 of the second switching element 22 becomes equal to or higher than the reference temperature T0 (the actual temperature is equal to or higher than the first comparison temperature Tc2) is not input changes to a state where the first comparison result C2 of "1" is input. Then, in a case where the calculated temperature Tx before the first correction is lower than the first comparison temperature Tc2, the calculated temperature Tx is corrected based on the difference between the first comparison temperature Tc2 and the calculated temperature Tx before the first correction. The difference between the first comparison temperature Tc2 and the calculated temperature Tx before the first correction is the additional amount $\Delta T$, and the calculated temperature Tx after the first correction is determined by adding the additional amount $\Delta T$ to the calculated temperature Tx before the first correction. The calculation processing unit 111 adds the first additional amount $\Delta T$ to the correction amount $\alpha$ of the temperature characteristic function Ft. The intercept of the temperature characteristic function Ft increases.

The calculation processing unit 111 of the control device 100 compares the calculated temperature Tx before the second correction with the second comparison temperature Tc3 when a state where the second comparison result C3 of "1" indicating that the detected temperature T3 of the third switching element 23 becomes equal to or higher than the reference temperature T0 is not input changes to a state where the second comparison result C3 of "1" is input. Then, in a case where the calculated temperature Tx before the second correction is lower than the second comparison temperature Tc3, the calculated temperature Tx is corrected based on the difference between the second comparison temperature Tc3 and the calculated temperature Tx before the second correction. The difference between the second comparison temperature Tc3 and the calculated temperature Tx before the second correction is the additional amount $\Delta T$, and the calculated temperature Tx after the second correction is determined by adding the additional amount $\Delta T$ to the calculated temperature Tx before the second correction. The calculation processing unit 111 adds the second additional amount $\Delta T$ to the correction amount $\alpha$ of the temperature characteristic function. Ft. The intercept of the temperature characteristic function Ft increases.

As described above, the first comparison temperature Tc2 is set as follows. That is, the actual temperature (102° C.) of the second switching element 22 when the first comparison result C2 of "1" indicating that the temperature T2 of the second switching element 22 detected by the second temperature sensor 32 becomes equal to or higher than the predetermined reference temperature T0 is transmitted to the control device 100 is determined in advance by an experiment, and this temperature (102° C.) is stored in advance in the storage device 200 as the first comparison temperature Tc2.

In such a state, for example, it is assumed that, at a certain time, the temperature of the first switching element 21 is 100° C., and the temperature of the second switching element 22 is 100° C. In this case, since the first comparison result C2 of "1" indicating that the temperature T2 of the second switching element 22 detected by the second temperature sensor 32 becomes equal to or higher than the reference temperature T0 (the actual temperature is equal to or higher than the first comparison temperature Tc2) is not input to the control device 100, the control device 100 controls the operations of the first switching element 21, the second switching element 22, and the third switching element 23 based on the calculated temperature Tx before correction. Thereafter, it is assumed that the temperature of the second switching element 22 increases, becomes higher than the temperature of the first switching element 21, and becomes 102° C. In this case, the first comparison result C2 indicating that the detected temperature T2 of the second switching element becomes equal to or higher than the reference temperature T0 (the actual temperature is equal to or higher than the first comparison temperature Tc2) is input to the control device 100. When this happens, the calculation processing unit 111 of the control device 100 corrects the calculated temperature to 102° C. based on the difference (2° C.) between the first comparison temperature Tc2 (102° C.) and the calculated temperature Tx (for example, 100° C.) before correction. The difference (2° C.) between the first comparison temperature Tc2 (102° C.) and the calculated temperature Tx (100° C.) before correction is the additional amount $\Delta T$, and the calculated temperature (102° C.) after correction is determined by adding the additional amount $\Delta T$ (2° C.) to the calculated temperature Tx (100° C.) before correction. Then, the control device 100 controls the operations of the first switching element 21, the second switching element 22, and the third switching element 23 based on the calculated temperature (102° C.) after correction. Accordingly, it is possible to control the operation of the electric power conversion device 1 based on the temperature of the high-temperature switching element 20 among a plurality of switching elements 20.

The same as the first comparison temperature Tc2 applies to the second comparison temperature Tc3. That is, the actual temperature (105° C.) of the third switching element 23 when the second comparison result C3 indicating that the temperature T3 of the third switching element 23 detected by the third temperature sensor 33 becomes equal to or higher than the reference temperature T0 is transmitted to the control device 100 is determined in advance, and this temperature (105° C.) is stored in advance in the storage device 200 as the second comparison temperature Tc3. The calculation processing unit 111 of the control device 100 corrects the calculated temperature to 105° C. based on the difference (3° C.) between the second comparison temperature Tc3 (105° C.) and the calculated temperature Tx (for example, 102° C.) before correction. The difference (3° C.) between the second comparison temperature Tc3 (105° C.) and the calculated temperature Tx (102° C.) before correction is the additional amount ΔT, and the calculated temperature Tx (105° C.) after correction is determined by adding the additional amount ΔT (3° C.) to the calculated temperature Tx (102° C.) before correction.

In a configuration in which the electric power conversion device 1 includes the second switching element 22 and the third switching element 23, correction for the calculated temperature Tx may be performed twice. In the above-described example, first, the first correction based on the temperature of the second switching element 22 is performed, and thereafter, the second correction based on the temperature of the third switching element 23 is performed. In this case, in a case where correction is performed multiple times, the calculated temperature Tx reflecting the previous correction becomes the calculated temperature Tx before correction in the present correction. That is, correction is performed again for the calculated temperature Tx (the calculated temperature Tx before the present correction) reflecting the previous correction at the present time. In the above-described example, the calculated temperature Tx reflecting the previous (first) correction based on the temperature of the second switching element 22 becomes the calculated temperature Tx before correction when the present (second) correction based on the temperature of the third switching element 23 is performed. Therefore, "before" correction and "after" correction in this specification indicate the before-after relationship in each correction. The same applies to a case where the number of switching elements further increases.

According to the above-described electric power conversion device 1, the second transmission circuit 62 can be made to have a configuration simpler than the first transmission circuit 61. That is, in the first transmission circuit 61, the first voltage V1 indicating the temperature T1 of the first switching element 21 detected by the first temperature sensor 31 is input to the control device 100. Since the temperature T1 of the first switching element 21 detected by the first temperature sensor 31 has "multi values (for example, . . . , 99° C., 100° C., 101° C., . . . )", the first voltage V1 indicating this temperature also has "multi values". Accordingly, since the first transmission circuit 61 inputs the "multi values" to the control device 100, the configuration thereof becomes complicated. In the second transmission circuit 62, the first comparison result C2 indicating that the detected temperature T2 of the second switching element 22 becomes equal to or higher than the reference temperature T0 (the actual temperature is equal to or higher than the first comparison temperature Tc2) is input to the control device 100. The first comparison result C2 indicating that the detected temperature T2 of the second switching element 22 becomes equal to or higher than the reference temperature T0 (the actual temperature is equal to or higher than the first comparison temperature Tc2) has "two values (for example, yes and no or 1 and 0) regarding whether or not the detected temperature T2 of the second switching element 22 is equal to or higher than the reference temperature T0 (equal to or higher than the first comparison temperature Tc2). Accordingly, since the second transmission circuit 62 inputs the "two values" to the control device 100, the configuration thereof is made simpler than the first transmission circuit 61 which inputs the "multi values" to the control device 100. With this, even in a configuration in which the first transmission circuit 61 and the second transmission circuit 62 are provided, an input operation is divided into a "multi-value" input and a "two-value" input, whereby it is possible to make a simple configuration as a whole. Furthermore, it is possible to reduce costs.

The same as the second transmission circuit 62 applies to the third transmission circuit 63. In the third transmission circuit 63, the second comparison result C3 indicating that the detected temperature T3 of the third switching element 23 becomes equal to or higher than the reference temperature T0 (the actual temperature is equal to or higher than the second comparison temperature Tc3) is input to the control device 100. The second comparison result C3 indicating that the detected temperature T3 of the third switching element 23 becomes equal to higher than the reference temperature T0 (the actual temperature is equal to or higher than the second comparison temperature Tc3) has "two values (for example, yes and no or 1 and 0) regarding whether or not the detected temperature T3 of the third switching element 23 becomes equal to or higher than the reference temperature T0 (equal to or higher than the second comparison temperature Tc3). Accordingly, since the third transmission circuit 63 inputs the "two values" to the control device 100, the configuration thereof is made simpler than the first transmission circuit 61 which inputs the "multi values" to the control device 100.

From above, according to the above-described electric power conversion device 1, it is possible to control the operation based on the temperature of a high-temperature switching element 20 among a plurality of switching elements 20 even with a simple configuration.

In the above-described electric power conversion device 1, in a case where the calculated temperature Tx (in a case where the correction processing is performed, the calculated temperature Tx reflecting the correction processing) is equal to or higher than the limit temperature Ta, the control processing unit 112 of the control device 100 limits the load factors of the switching elements 20. With this, a configuration is made so as to decrease electric power output from the electric power conversion device 1. According to this configuration, it is possible to limit the load factor of the electric power conversion device 1 based on the temperature of the high-temperature switching element 20. It is possible to prevent overheating of the switching elements.

In the above-described electric power conversion device 1, the first transmission circuit 61 includes the first insulating coupler 51 which transmits the first voltage V1 in a state where the first temperature sensor 31 side and the control device 100 side are electrically insulated from each other. The second transmission circuit 62 includes the second insulating coupler 52 which transmits the first comparison result C2 by the first comparison circuit 42 in a state where the first comparison circuit 42 side and the control device 100 side are electrically insulated from each other. In such a configuration, it is possible to make the configuration of the second insulating coupler 52 simpler than the first insulating coupler 51. That is, while the first voltage V1 which is transmitted from the first insulating coupler 51 has the "multi values" as described above, and the first insulating coupler 51 requires high performance in order to transmit the first voltage V1 and is expensive, the first comparison result C2 which is transmitted from the second insulating coupler 52 has the "two values" as described above, and the configuration of the second insulating coupler 52 for transmitting the first comparison result C2 can be made simple. Therefore, even in a configuration in which the first insulating coupler 51 and the second insulating coupler 52 are provided, an input operation is divided into a "multi-value" input and a "two-value" input, whereby it is possible to make a simple configuration as a whole. Furthermore, it is possible to reduce costs. The same as the second insulating coupler 52 applies to the third insulating coupler 53.

In the above-described electric power conversion device 1, in a case where the calculated temperature Tx reflecting the correction processing is lower than the predetermined reset temperature Tb, the calculation processing unit 111 of the control device 100 resets the correction of the calculated temperature Tx. With this, it is possible to reset learning when the temperature of the switching element 20 decreases. Accordingly, it is possible to perform the correction processing again from the initial state.

Although one example has been described above, a specific aspect is not limited to the above-described example. In the following description, the same configurations as the configurations in the above-described example are represented by the same reference numerals, and description thereof will not be repeated.

Figure 14:
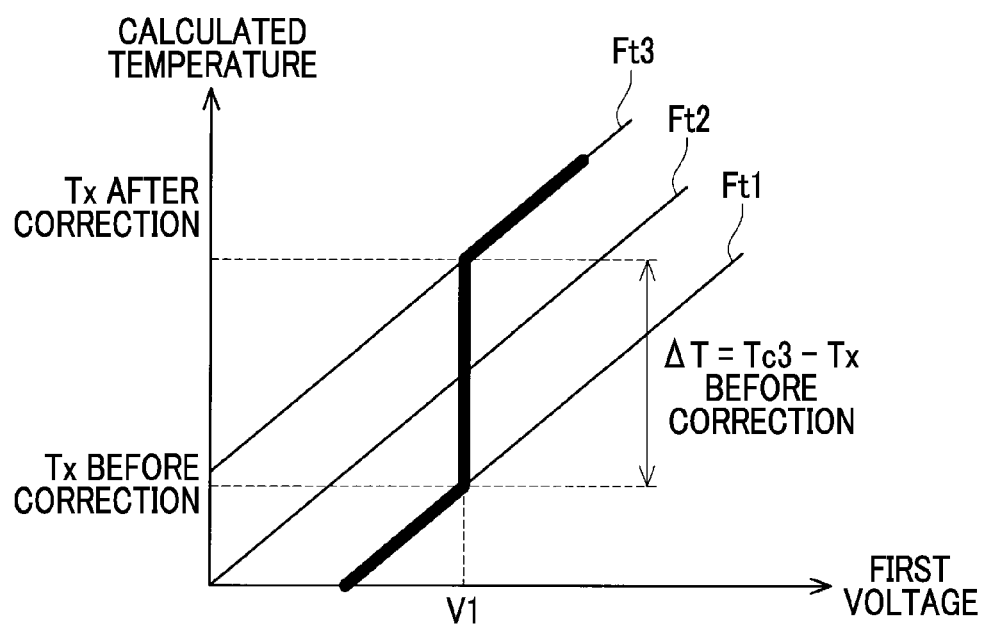
FIG. 14 is a graph showing the relationship between a first voltage and a calculated temperature according to another example.

In the above-described example, although a state where the control device 100 corrects the temperature characteristic function Ft from the first temperature characteristic function RI to the second temperature characteristic function Ft2, and thereafter, corrects the second temperature characteristic function Ft2 to the third temperature characteristic function Ft3 has been described, embodiments are not limited thereto. In another example, as shown in FIG. 14, the control device 100 may directly correct the temperature characteristic function Ft from the first temperature characteristic function Ft1 to the third temperature characteristic function Ft3. For example, if the temperature of the third switching element 23 is significantly increasing compared to the second switching element 22, since the second comparison result C3 is input to the control device 100 in an early stage, such correction is performed.

Second Example

Figure 15:
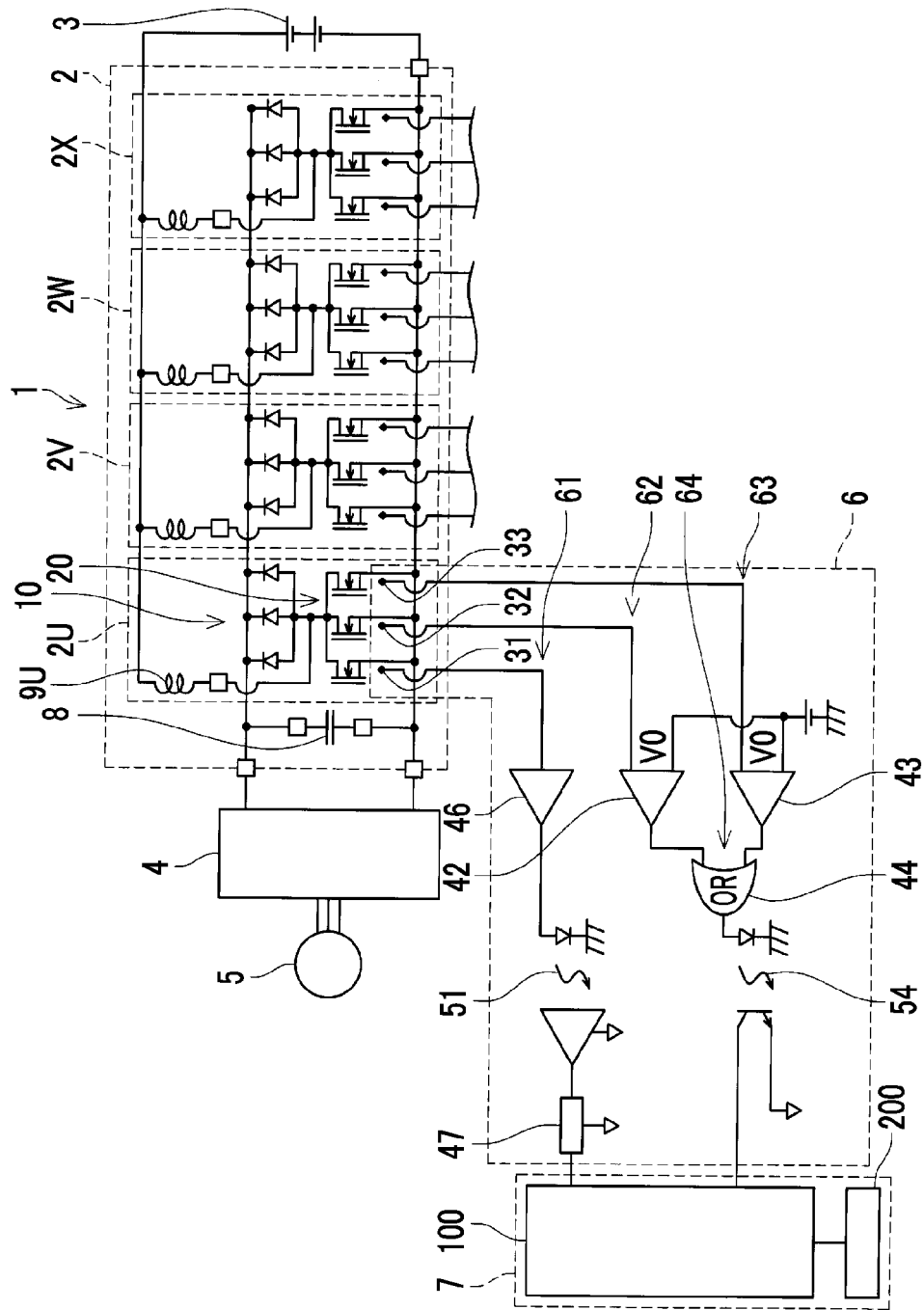
FIG. 15 is a circuit configuration diagram of an electric power conversion device according to a second example.

As shown in FIG. 15, in an electric power conversion device 1 according to a second example, the circuit unit 6 includes a fourth transmission circuit 64. The fourth transmission circuit 64 is connected to the first comparison circuit 42, the second comparison circuit 43, and the control device 100. The fourth transmission circuit 64 transmits a signal to the control device 100. The fourth transmission circuit 64 includes an OR circuit 44 and a fourth insulating coupler 54.

The OR circuit 44 is electrically connected to the first comparison circuit 42 and the second comparison circuit 43. The OR circuit 44 outputs a signal of "1" in a case where the first comparison result C2 output from the first comparison circuit 42 is "1" or in a case where the second comparison result C3 output from the second comparison circuit 43 is "1". The OR circuit 44 outputs "1" when at least one of the first comparison result C2 or the second comparison result C3 is "1". The OR circuit 44 outputs a logical sum of the first comparison result C2 and the second comparison result C3. For example, the OR circuit 44 outputs the signal of "1" if the signal of "1" is input from the first comparison circuit 42. The OR circuit 44 outputs the signal of "1" if the signal of "1" is input from the second comparison circuit 43.

The fourth insulating coupler 54 is electrically connected to the OR circuit 44 and the control device 100. The fourth insulating coupler 54 transmits the digital signal output from the OR circuit 44 to the control device 100. As the fourth insulating coupler 54, a photocoupler or a magnetic coupler can be used. Other configurations of the fourth insulating coupler 54 are the same as those of the second insulating coupler 52 and the third insulating coupler 53 described above, and thus, detailed description thereof will not be repeated.

Next, the operation of the electric power conversion device will be described. In the electric power conversion device 1 according to the second example, the first comparison result C2 ("0" or "1") output from the first comparison circuit 42 is input to the OR circuit 44. Furthermore, the second comparison result C3 ("0" or "1") output from the second comparison circuit 43 is input to the OR circuit 44. In a case where it is determined in the first comparison circuit 42 that the second voltage V2 (the detected temperature T2 of the second switching element 22) becomes equal to or greater than the predetermined reference voltage V0 (the reference temperature T0), the first comparison result C2 of "1" is input to the OR circuit 44. That is, when the actual temperature of the second switching element 22 becomes equal to or higher than the first comparison temperature Tc2, the first comparison result C2 of "1" is input to the OR circuit 44. In a case where it is determined in the second comparison circuit 43 that the third voltage V3 (the detected temperature T3 of the third switching element 23) becomes equal to or greater than the predetermined reference voltage V0 (the reference temperature T0), the second comparison result C3 of "1" is input to the OR circuit 44. That is, when the actual temperature of the third switching element 23 becomes equal to or higher than the second comparison temperature Tc3, the second comparison result C3 of "1" is input to the OR circuit 44.

The OR circuit 44 outputs the first comparison result C2 input from the first comparison circuit 42 and the second comparisons result C3 input from the second comparison circuit 43 as a logical sum. Therefore, if the first comparison result C2 of "1" is input from the first comparison circuit 42 or the second comparison result C3 of "1" is input from the second comparison circuit 43, the OR circuit 44 outputs the signal of "1" as a logical sum.

The fourth insulating coupler 54 outputs the signal as the logical sum input from the OR circuit 44 to the control device 100. The fourth insulating coupler 54 transmits the digital signal of the logical sum by the OR circuit 44 in a state where an input side (OR circuit 44 side) and an output side (control device 100 side) are electrically insulated from each other. The signal output from the fourth insulating coupler 54 is input to the control device 100.

Figure 16:
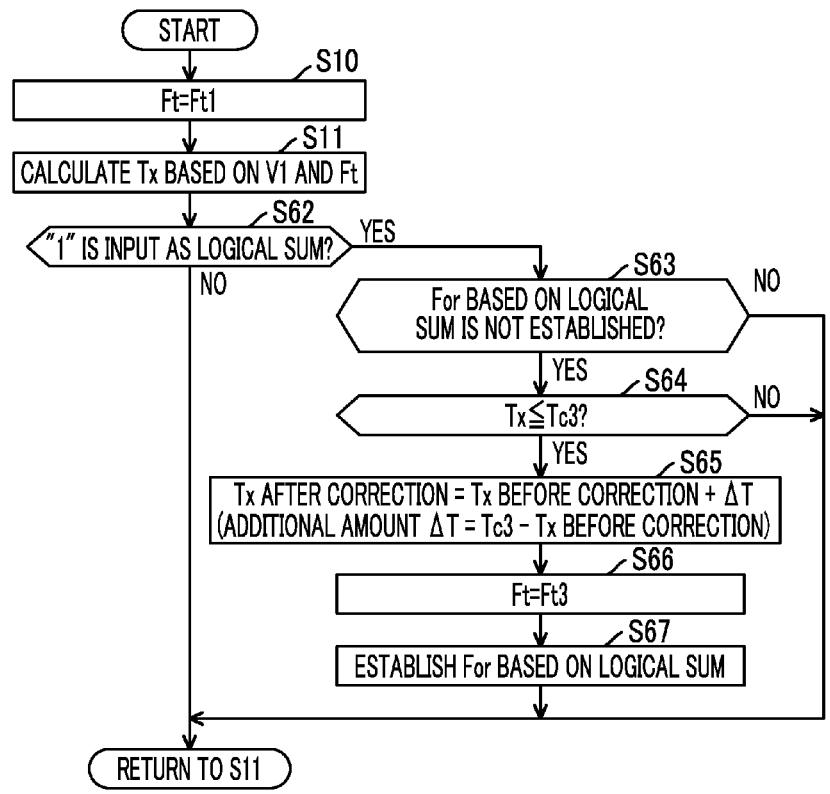
FIG. 16 is a flowchart of processing according to the second example which is executed by a control device.

Next, the operation of the control device will be described referring to FIG. 16. The processing of S10 and S11 in the second example are the same as S10 and S11 in the above-described first example, and thus, description thereof will not be repeated.

In S62 subsequent to S11, the calculation processing unit 111 determines whether or not the signal of the logical sum of "1" is input from the OR circuit 44. If the signal of the logical sum input from the OR circuit 44 changes from "0" to "1", the calculation processing unit 111 determines to be yes at this time and progresses to S63. In a case where the signal of the logical sum of "1" is not input from the OR circuit 44 (in a case where the signal of the logical sum of "0" is input), the calculation processing unit 111 skips S63 to S67 and returns to S11. That is, in a case where the signal of the logical sum input from the OR circuit 44 does not change from "0" to "1" (in a case where the state of "0" is maintained), the calculation processing unit 111 determines to be no and returns to S11.

Next, in S63, the calculation processing unit 111 determines whether or not a correction completion flag For based on the logical sum is set. The correction completion flag For is information indicating that the correction processing of the calculated temperature Tx is completed. In a case where the correction completion flag For is not set, the control device 100 determines to be yes in S63 and progresses to S64. In a case where the correction completion flag For is set, the control device 100 determines to be no, skips S64 to S67, and returns to S11.

Next, in S64, the calculation processing unit 111 compares the calculated temperature Tx calculated in S11 described above with the comparison temperature Tc. The comparison temperature Tc is stored in the storage device 200. The calculation processing unit 111 compares the calculated temperature Tx with the comparison temperature Tc which is a higher temperature out of the first comparison temperature Tc2 and the second comparison temperature Tc3. In this example, the second comparison temperature Tc3 is higher than the first comparison temperature Tc2. The calculation processing unit 111 compares the calculated temperature Tx with the second comparison temperature Tc3. In a case where the calculated temperature Tx is lower than the second comparison temperature Tc3, the calculation processing unit 111 determines to be yes in S64 and progresses to S65. In a case where the calculated temperature Tx is equal to or higher than the second comparison temperature Tc3, the calculation processing unit 111 determines to be no, skips S65 to S67, and returns to S11.

Figure 17:
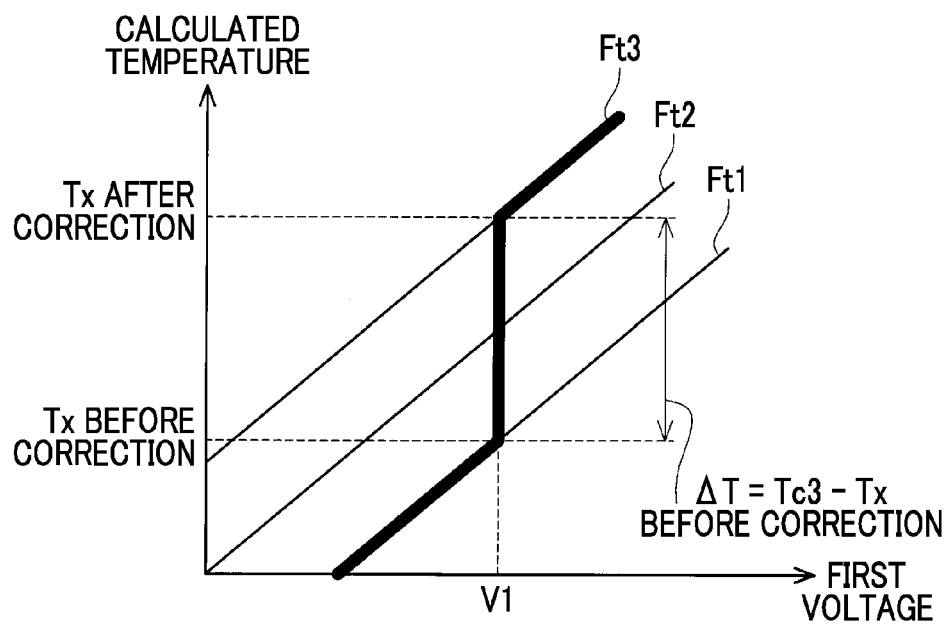
FIG. 17 is a graph showing the relationship between a first voltage and a calculated temperature according to the second example.

Next, in S65, the calculation processing unit 111 corrects the calculated temperature Tx calculated in S11 described above. Specifically, the calculation processing unit 111 calculates the additional amount $\Delta T$ based on the calculated temperature Tx before correction and the second comparison temperature Tc3. The additional amount $\Delta T$ is the difference between the second comparison temperature Tc3 and the calculated temperature Tx before correction. That is, the additional amount $\Delta T = Tc3 - Tx$ before correction. As shown in FIG. 17, the calculation processing unit 111 sets a temperature obtained by adding the additional amount $\Delta T$ to the calculated temperature Tx before correction as the calculated temperature Tx after correction. That is, Tx after correction=Tx before correction+$\Delta T$. The control device 100 recognizes the calculated temperature Tx after correction as the temperature of the switching element 20.

In subsequent S66, the calculation processing unit 111 corrects the temperature characteristic function Ft from the first temperature characteristic function Ft1 to the third temperature characteristic function Ft3. Specifically, the calculation processing unit 111 corrects the slope of the temperature characteristic function Ft from a1 for the first temperature characteristic function Ft1 to a3 for the third temperature characteristic function Ft3. The calculation processing unit 111 adds the additional amount $\Delta T$ calculated above to the correction amount $\alpha$ of the temperature characteristic function Ft. That is, the additional amount $\Delta T$ is added to the intercept of the temperature characteristic function Ft. The calculation processing unit 111 uses the third temperature characteristic function Ft3 as a future temperature characteristic function Ft. In subsequent S67, the calculation processing unit 111 sets the correction completion flag For based on the logical sum.

If the above-described processing ends, the calculation processing unit 111 returns to S11. In S11, if the correction processing is not performed even once, the calculation processing unit 111 calculates the calculated temperature Tx based on the first voltage V1 and the temperature characteristic function Ft. In a case where the temperature characteristic function Ft is corrected to the third temperature characteristic function Ft3, the third temperature characteristic function Ft3 is used. The calculation processing unit 111 of the control device 100 repeatedly performs the above-described processing. In this way, learning is performed.

As will be apparent from the above description, the electric power conversion device 1 according to the second example includes the first transmission circuit 61 which transmits the first voltage V1 (an example of a first signal) indicating the temperature T1 of the first switching element 21 detected by the first temperature sensor 31 to the control device 100. The electric power conversion device 1 also includes the second transmission circuit 62 which compares the temperature T2 of the second switching element 22 detected by the second temperature sensor 32 with the predetermined reference temperature by the first comparison circuit 42, and transmits the first comparison result C2 indicating that the detected temperature T2 of the second switching element 22 becomes equal to or higher than the reference temperature T0. That is, the second transmission circuit 62 transmits the first comparison result C2 indicating that the actual temperature of the second switching element 22 becomes equal to or higher than the first comparison temperature Tc2. The electric power conversion device 1 also includes the third transmission circuit 63 which compares the temperature T3 of the third switching element 23 detected by the third temperature sensor 33 with the predetermined reference temperature by the second comparison circuit 43, and transmits the second comparison result C3 indicating that the detected temperature T3 of the third switching element 23 becomes equal to or higher than the reference temperature T0. That is, the third transmission circuit 63 transmits the second comparison result C3 indicating that the actual temperature of the third switching element 23 becomes equal to or higher than the second comparison temperature Tc3. The electric power conversion device 1 also includes the fourth transmission circuit 64 which inputs the logical sum of the first comparison result C2 transmitted from the second transmission circuit 62 and the second comparison result C3 transmitted from the third transmission circuit 63 to the control device 100 through the OR circuit 44. If the first comparison result C2 of "1" indicating that the detected temperature T2 of the second switching element 22 becomes equal to or higher than the reference temperature T0 (the actual temperature is equal to or higher than the first comparison temperature Tc2) is input, the fourth transmission circuit 64 including the OR circuit 44 inputs the signal of "1" indicating the input of the first comparison result C2 of "1" to the control device 100. If the second comparison result C3 of "1" indicating that the detected temperature T3 of the third switching element 23 becomes equal to or higher than the reference temperature T0 (the actual temperature is equal to or higher than the second comparison temperature Tc3) is input, the fourth transmission circuit 64 inputs the signal of "1" indicating the input of the second comparison result C3 of "1" to the control device 100. The calculation processing unit 111 of the control device 100 compares the calculated temperature Tx with the comparison temperature Tc when a state where the signal of the logical sum of "1" by the OR circuit 44 is not input changes to a state where the signal of the logical sum of "1" is input. The calculation processing unit 111 compares the high temperature-side temperature out of the first comparison temperature Tc2 and the second comparison temperature Tc3 with the calculated temperature Tx. Then, in a case where the calculated temperature Tx is lower than the higher comparison temperature Tc, the calculated temperature Tx is corrected based on the difference between the high temperature-side comparison temperature Tc and the calculated temperature Tx. The difference between the high temperature-side comparison temperature Tc and the calculated temperature Tx before correction is the additional amount ΔT, and the calculated temperature Tx after correction is determined by adding the additional amount ΔT to the calculated temperature Tx before correction. The calculation processing unit 111 adds the additional amount ΔT to the correction amount α of the temperature characteristic function Ft. The intercept of the temperature characteristic function Ft increases.

According to such a configuration, as in the above-described first example, it is possible to control the operation of the electric power conversion device 1 based on the temperature of the high-temperature switching element 20 among a plurality of switching elements 20.

According to the above-described electric power conversion device 1, it is possible to make the fourth transmission circuit 64 have a simple configuration. That is, in the fourth transmission circuit 64, the signal of the logical sum of the first comparison result C2 and the second comparison result C3 is input to the control device 100. The first comparison result C2 and the second comparison result C3 have "two values (for example, yes and no or 1 and 0) regarding whether or not the detected temperature of the switching element becomes equal to or higher than the reference temperature T0. Accordingly, since the fourth transmission circuit 64 inputs the "two values" to the control device 100, the configuration thereof is made simpler than a configuration in which the "multi values" are input to the control device 100.

In the electric power conversion device 1 of the second example, the logical sum of the comparison result (the first comparison result C2 by the first comparison circuit 42) indicating that the detected temperature T2 of the second switching element 22 becomes equal to or higher than the reference temperature T0 (the actual temperature is equal to or higher than the first comparison temperature Tc2) and the comparison result (the second comparison result C3 by the second comparison circuit 43) indicating that the detected temperature T3 of the third switching element 23 becomes equal to or higher than the reference temperature T0 (the actual temperature is equal to or higher than the second comparison temperature Tc3) is input to the control device 100 through the OR circuit 44. The control device 100 does not distinguish whether the comparison result is the first comparison result C2 by the first comparison circuit 42 or the second comparison result C3 by the second comparison circuit 43. For this reason, it is possible to control the operation on a safer side. For example, in a case where the temperature of the second switching element 22 is higher than the temperature of the third switching element 23, even if the comparison result (the second comparison result C3 by the second comparison circuit 43) relating to the third switching element 23 is not input to the control device, the comparison result (the first comparison result C2 by the first comparison circuit 42) relating to the second switching element 22 is input to the control device 100, whereby the control device 100 corrects the calculated temperature Tx. With this, since the comparison result on the low temperature side can be regarded as the same as the comparison result on the high temperature side, it is possible to control the operation on a safer side.

Third Example

Figure 18:
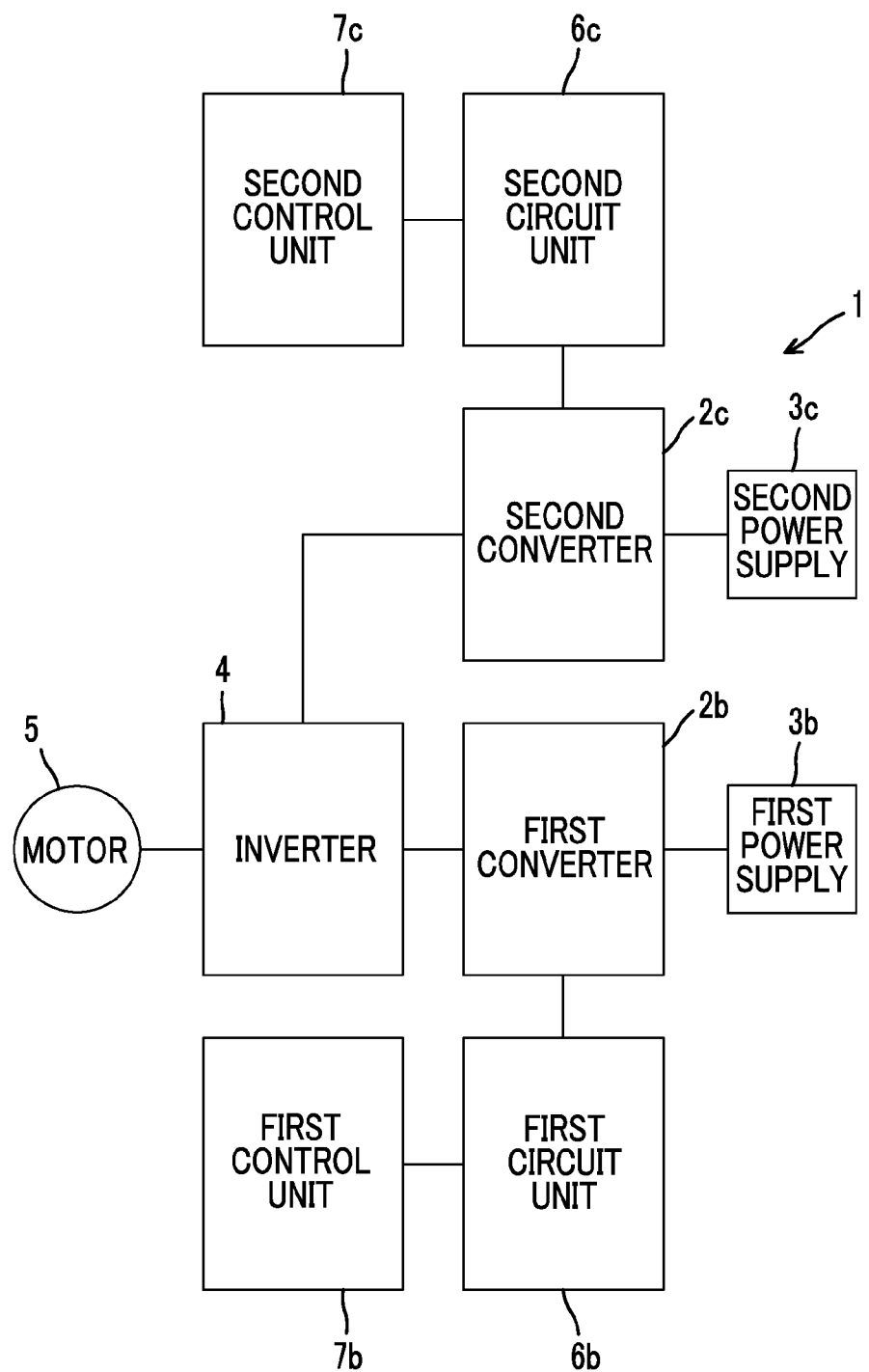
FIG. 18 is a block diagram of an electric power conversion device according to a third example.

As shown in FIG. 18, an electric power conversion device 1 according to a third example includes a first converter 2b, a second converter 2c, and an inverter 4. The electric power conversion device 1 also includes a first circuit unit 6b, a first control unit 7b, a second circuit unit 6c, and a second control unit 7c. The first converter 2b and the second converter 2c are connected to the inverter 4. The first converter 2b is connected to a first power supply 3b, and the second converter 2c is connected to a second power supply 3c. The configurations of the first converter 2b and the second converter 2c are the same as the configuration of the converter 2 described above. The configurations of the first circuit unit 6b and the second circuit unit 6c are the same as the configuration of the circuit unit 6 described above. The configurations of the first control unit 7b and the second control unit 7c are the same as the configuration of the control unit 7 described above. Thus, detailed description of these configurations will not be repeated.

The first power supply 3b is a storage battery, and the second power supply 3c is a fuel battery. In this example, the temperature of a switching element (not shown) in the second converter 2c connected to the second power supply 3c (fuel battery) is detected. Such a configuration can be employed in a fuel battery vehicle.

In the respective examples described above, although a configuration in which the temperature of the switching element in the converter has been made, embodiments are not limited to this configuration. In other examples, a configuration in which the temperature of a switching element (not shown) in an inverter is detected may be made.

The slopes of the linear functions including the first temperature characteristic function Ft1, the second temperature characteristic function Ft2, and the third temperature characteristic function Ft3 in the above-described examples are not particularly limited. The slopes may be identical or different.

The configurations of the modulation circuit 46 and the demodulation circuit 47 described above are not particularly limited. For example, the modulation circuit 46 can use a configuration of pulse width modulation (PWM) or pulse density modulation (PDM). The demodulation circuit 47 can use a configuration in which a pulse width is counted by a microcomputer, or a configuration in which DC current conversion is performed by a low-pass filter (LPF) and the DC current is read at an A/D port of a microcomputer. The respective configurations may be combined.

In the above-described examples, although a configuration in which the correction completion flag F (the second correction completion flag F2, the third correction completion flag F3, or the correction completion flag F or based on the logical sum) is set has been made, embodiments are not limited to this configuration. In other examples, the correction completion flag F may not be set. The calculation processing unit 111 of the control device 100 may perform correction based on the comparison result of the first comparison circuit 42 multiple times. The calculation processing unit 111 may perform correction based on the comparison result of the second comparison circuit 43 multiple times. The calculation processing unit 111 repeatedly executes the correction processing based on the respective comparison results. The calculation processing unit 111 adds the additional amount ΔT (the difference between the comparison temperature and the calculated temperature) to the correction amount α for each correction processing.

Although the specific examples of the embodiment have been described above in detail, these are just illustrative, embodiments are not limited to these. Some embodiments include modifications and variations of the specific examples illustrated above. Technical elements described in this specification or the drawings are technically useful alone or in various combinations, and embodiments are not limited thereto. The art illustrated in this specification or the drawings may concurrently achieve a plurality of objects, and is technically useful for achieving any one of such objects.

Hereinafter, examples of the technical elements disclosed in this specification will be described. The technical elements described below are respectively independent technical elements, and are technically useful alone or in various combinations.

In the first aspect of the present disclosure, while the first switching element and the second switching element are connected in parallel with each other, and are controlled in common by the control device, the temperatures of the switching elements are different due to an individual difference between the switching elements or a difference in thermal environment in which the switching elements are placed, or the like. The temperature of the first switching element is detected by the first temperature sensor, and the temperature of the second switching element is detected by the second temperature sensor. Then, the first signal indicating the temperature of the first switching element detected by the first temperature sensor is input to the control device through the first transmission circuit. The calculation processing unit of the control device calculates the calculated temperature using the input first signal and the correction amount. The control processing unit of the control device controls the operations of the first switching element and the second switching element based on the calculated temperature. In a case where the temperature of the first switching element is high, and the temperature of the second switching element is low, it is possible to prevent overheating the high temperature-side switching element (in this case, the first switching element). As a matter of course, it is also possible to prevent overheating the low temperature-side switching element.

The temperature of the second switching element detected by the second temperature sensor is compared with the predetermined first comparison temperature in the second transmission circuit. Then, when the temperature of the second switching element becomes equal to or higher than the first comparison temperature, in a case where the calculated temperature is lower than the first comparison temperature, the calculated temperature is corrected based on the difference between the first comparison temperature and the calculated temperature. As a result, when the second switching element is at a higher temperature than the first switching element, it is possible to control the operations of the first switching element and the second switching element based on the corrected calculated temperature accordingly. Even if the temperature of the first switching element is low and the temperature of the second switching element is high, it is possible to prevent overheating of the high temperature-side switching element.

The first comparison temperature is set based on the following thinking. The following description focuses on the temperature of the second switching element when the comparison result indicating that the temperature of the second switching element is equal to or higher than the first comparison temperature is transmitted to the control device. If there are no errors or the like, the temperature should be equal to the reference temperature in design. However, errors actually occur. Such errors primarily occur due to product errors of the second temperature sensor and the second transmission circuit. For example, even if the reference temperature in design is 100° C., and it is configured such that, if the temperature of the second switching element becomes equal to or higher than 100° C., the comparison result indicating that the temperature of the second switching element becomes equal to or higher than the reference temperature is transmitted to the control device, actually, while the temperature of the second switching element becomes equal to or higher than 100° C., the comparison result may not be transmitted to the control device. A product may be made in which the comparison result is transmitted to the control device for the first time when the temperature of the second switching element becomes equal to or higher than, for example, 102° C. Accordingly, the actual temperature (in the above-described example, 102° C.) of the second switching element when the comparison result indicating that the temperature of the second switching element becomes equal to or higher than the reference temperature is transmitted to the control device is measured in advance, and this temperature is stored in advance in the storage unit as the first comparison temperature.

Under such a setting situation, the temperature of the second switching element is lower than the first comparison temperature. In this case, since the comparison result indicating that the temperature of the second switching element becomes equal to or higher than the first comparison temperature (in design, the comparison result indicating that the temperature of the second switching element becomes equal to or higher than the reference temperature) is not input to the control device, the control device controls the operations of the first switching element and the second switching element based on the calculated temperature before correction. Since the temperature of the second switching element is lower than the first comparison temperature, and control for overheating prevention is not required, control may be performed based on the temperature of the first switching element. If the temperature of the first switching element increases, control is performed based on this temperature, whereby it is possible to prevent the first switching element from being overheated.

The temperature of the second switching element increases, becomes higher than the temperature of the first switching element, and increases to the first comparison temperature. When this happens, the comparison result indicating that the temperature of the second switching element becomes equal to or higher than the first comparison temperature (in design, the comparison result indicating that the temperature of the second switching element becomes equal to or greater than the reference temperature) is input to the control device. In this case, the calculated temperature before correction indicates the temperature of the first switching element at a lower temperature than the second switching element, and if control is performed based on this temperature, the second switching element may be overheated. In this case, the control device adds the difference (2° C.) between the first comparison temperature (for example, 102° C.) and the calculated temperature (for example, 100° C.) to the correction amount. That is the control device corrects the calculated temperature to 102° C. Then, the control device controls the operations of the first switching element and the second switching element based on the calculated temperature (102° C.) after correction. Accordingly, it is possible to control the operation of the electric power conversion device based on the high-temperature switching element among a plurality of switching elements.

According to the above-described electric power conversion device, it is possible to make the second transmission circuit have a configuration simpler than the first transmission circuit. That is, the first transmission circuit transmits the first signal indicating the temperature of the first switching element detected by the first temperature sensor to the control device. The first transmission circuit needs to transmit an analog signal. Realizing a circuit which accurately transmits an analog signal requires high costs. In particular, in transmitting an analog signal through an insulating coupler accurately with no time delay, an expensive insulating coupler is required. A system which converts a temperature signal to a digital value and transmits the digital value may also be taken. In this case, the temperature of the first switching element detected by the first temperature sensor has "multi values (for example, . . . , 99° C., 100° C., 101° C., . . . )". The first signal indicating this temperature also has "multi values". Accordingly, since the first transmission circuit transmits the "multi values" to the control device, the configuration thereof becomes complicated. In a case of transmitting the first signal in the first transmission circuit, for example, a modulation system, such as pulse code modulate (PCM), pulse width modulation (PWM), or pulse density modulation (PDM), can be used. In all cases, the configuration becomes complicated, and if a plurality of transmission circuits are used, costs increase.

The second transmission circuit may transmit, to the control device, the comparison result indicating that the temperature of the second switching element is equal to or higher than the first comparison temperature. This comparison result has "two values (for example, yes and no, high and low, or "1" and "0")". Since the second transmission circuit may transmit the "two values" to the control device, the configuration thereof is simpler than the first transmission circuit which transmits "analog value or multi values". With this, even in a configuration in which the first transmission circuit and the second transmission circuit are provided, an input operation is divided into a "multi-value" input and a "two-value" input, whereby it is possible to make a simple configuration as a whole.

The art disclosed in this specification is effective even in a case where three or more switching elements are connected in parallel with one another.

In a case where three switching elements are connected in parallel with one another, the comparison results of the second transmission circuit which compares the temperature of the second switching element with the first comparison temperature and the third transmission circuit which compares the temperature of the third switching element with the second comparison temperature are input to the control device, and in a case where the calculated temperature when the temperature of any switching element becomes equal to or higher than the comparison temperature is lower than the comparison temperature, the calculated temperature may be corrected. The comparison result of the second transmission circuit and the comparison result of the third transmission circuit may be distinguished. In this case, since it is possible to determine a switching element whose temperature becomes equal to or higher than the comparison temperature, when the temperature of the second switching element becomes equal to or higher than the first comparison temperature, correction may be performed based on the difference between the first comparison temperature and the calculated temperature, and when the temperature of the third switching element becomes equal to or greater than the second comparison temperature, correction may be performed based on the difference between the second comparison temperature and the calculated temperature.

In the second aspect of the present disclosure, the logical sum of the comparison result (first comparison result) indicating that the detected temperature of the second switching element becomes equal to or higher than the first comparison temperature and the comparison result (second comparison result) indicating that the detected temperature of the third switching element becomes equal to or higher than the second comparison temperature is input to the control device through the OR circuit. The control device does not distinguish whether the comparison result is the first comparison result or the second comparison result. For this reason, it is possible to control the operation on a safer side. For example, in a case where the temperature of the second switching element is higher than the temperature of the third switching element, even if the comparison result (second comparison result) relating to the third switching element is not input to the control device, the comparison result (first comparison result) relating to the second switching element is input to the control device, whereby the control device corrects the calculated temperature. With this, it is possible to control a plurality of switching elements according to the comparison result of the high temperature-side switching element, and to control the operation of the switching element on a safer side.

The control processing unit may be configured to decrease electric power output from the electric power conversion device in a case where the calculated temperature is equal to or higher than a predetermined limit temperature set to a higher temperature than the comparison temperature.

According to such a configuration, it is possible to limit the load factor of the electric power conversion device based on the calculated temperature. Accordingly, it is possible to prevent overheating of the switching elements.

The first transmission circuit may include the first insulating coupler which transmits the first signal in a state where the first temperature sensor side and the control device side are electrically insulated from each other. The second transmission circuit may include the second insulating coupler which transmits the comparison result in a state where the second temperature sensor side and the control device side are electrically insulated from each other.

The comparison result in the second transmission circuit is a "two-value" signal indicating whether or not the temperature of the second switching element is equal to or higher than the reference temperature. The second insulating coupler transmits the "two-value" signal. While a configuration becomes complicated in a case where a multi-value" signal, such as an analog signal, is transmitted, the second insulating coupler merely the "two-value" signal, whereby it is possible to simplify a configuration.

The electric power conversion device may include the third switching element connected in parallel with the first switching element and the second switching element, and the third temperature sensor which detects the temperature of the third switching element. The electric power conversion device may also include the third transmission circuit which transmits, to the control device, the comparison result indicating whether or not the temperature of the third switching element detected by the third temperature sensor is equal to or higher than the predetermined second comparison temperature. The control processing unit may control the operations of the first switching element, the second switching element, and the third switching element based on the calculated temperature calculated by the calculation processing unit. The storage unit may store the predetermined second comparison temperature. The calculation processing unit may execute processing for adding the difference between the second comparison temperature and the calculated temperature to the correction amount if the calculated temperature is lower than the second comparison temperature when the comparison result transmitted from the third transmission circuit changes from the comparison result indicating that the temperature of the third switching element is lower than the second comparison temperature to the comparison result indicating that the temperature of the third switching element is equal to or higher than the second comparison temperature.

Even in a configuration in which the third switching element is provided, like in a case of the second switching element, it is possible to control the operation of the electric power conversion device based on the temperature of the high-temperature switching element among a plurality of switching elements.

The fourth transmission circuit may include the fourth insulating coupler which transmits the output result of the OR circuit in a state where the OR circuit side and the control device side are electrically insulated from each other.

As described above, the comparison result in the second transmission circuit and the comparison result in the third transmission circuit are the "two-value" signals. The fourth insulating coupler merely transmits the "two-value" signal, whereby it is possible to simplify a configuration.

The calculation processing unit may reset the correction of the calculated temperature in a case where the calculated temperature is lower than the predetermined reset temperature.

According to such a configuration, it is possible to perform reset processing in a case where the temperature of the switching element decreases, and to perform the correction of the calculated temperature again from the initial state.

According to the first aspect of the disclosure, the control device may be configured to make electric power output from the electric power conversion device lower than a current output when it is determined that the calculated temperature is equal to or higher than a limit temperature set to a higher temperature than the first comparison temperature.

According to the first aspect of the disclosure, the first transmission circuit may include a first insulating coupler configured to transmit the first signal to the control device in a state where the first temperature sensor and the control device are electrically insulated from each other, and the second transmission circuit may include a second insulating coupler configured to transmit the first comparison result to the control device in a state where the second temperature sensor and the control device are electrically insulated from each other.

According to the first aspect of the disclosure, the electric power conversion device may further includes a third switching element connected in parallel with the first switching element and the second switching element; a third temperature sensor configured to detect the temperature of the third switching element; and a third transmission circuit configured to transmit, to the control device, a second comparison result indicating whether or not the temperature of the third switching element detected by the third temperature sensor is equal to or higher than a predetermined second comparison temperature, wherein the storage device may be configured to store the second comparison temperature, and the control device may be configured to: control the operations of the first switching element, the second switching element, and the third switching element based on the calculated temperature, and add the difference between the second comparison temperature and the calculated temperature to the correction amount when the control device determines that the second comparison result changes from lower than the second comparison temperature to equal to or higher than the second comparison temperature, and that the calculated temperature is lower than the second comparison temperature.

According to the second aspect of the disclosure, the control device may be configured to make electric power output from the electric power conversion devices lower than a current output when it is determined that the calculated temperature is equal to or higher than a limit temperature set to a higher temperature than the high-temperature comparison temperature.

According to the second aspect of the disclosure, the first transmission circuit may include a first insulating coupler configured to transmit the first signal to the control device in a state where the first temperature sensor and the control device are electrically insulated from each other, and the fourth transmission circuit may include a fourth insulating coupler configured to transmit an output result of the OR circuit to the control device in a state where the OR circuit and the control device are electrically insulated from each other.

According to the first and the second aspect of the disclosure, the control device may be configured to reset the correction of the calculated temperature when the calculated temperature is lower than a predetermined reset temperature.

What is claimed is:

1. An electric power conversion device comprising:
   a first switching element;
   a second switching element connected in parallel with the first switching element;
   a control device having a central processing unit, the control device being configured to perform calculation and control by the central processing unit;
   a first temperature sensor configured to detect the temperature of the first switching element;
   a second temperature sensor configured to detect the temperature of the second switching element;
   a first transmission circuit configured to transmit a first signal indicating the temperature of the first switching element detected by the first temperature sensor to the control device; and
   a second transmission circuit configured to transmit, to the control device, a first comparison result indicating that the temperature of the second switching element detected by the second temperature sensor is equal to or higher than a predetermined first comparison temperature,
   wherein the control device has a storage device configured to store the first comparison temperature and a correction amount, and
   the control device is configured to:
      calculate a calculated temperature using the first signal and the correction amount;
      control the operations of the first switching element and the second switching element based on the calculated temperature; and
      add the difference between the first comparison temperature and the calculated temperature to the correction amount when the control device determines that the first comparison result changes from lower than the first comparison temperature to equal to or higher than the first comparison temperature, and that the calculated temperature is lower than the first comparison temperature.

2. The electric power conversion device according to claim 1,
wherein the control device is configured to make electric power output from the electric power conversion device lower than a current output when it is determined that the calculated temperature is equal to or higher than a limit temperature set to a higher temperature than the first comparison temperature.

3. The electric power conversion device according to claim 1,
wherein the first transmission circuit includes a first insulating coupler configured to transmit the first signal to the control device in a state where the first temperature sensor and the control device are electrically insulated from each other, and
the second transmission circuit includes a second insulating coupler configured to transmit the first comparison result to the control device in a state where the second temperature sensor and the control device are electrically insulated from each other.

4. The electric power conversion device according to claim 1, further comprising:
a third switching element connected in parallel with the first switching element and the second switching element;
a third temperature sensor configured to detect the temperature of the third switching element; and
a third transmission circuit configured to transmit, to the control device, a second comparison result indicating whether or not the temperature of the third switching element detected by the third temperature sensor is equal to or higher than a predetermined second comparison temperature,
wherein the storage device is configured to store the second comparison temperature, and
the control device is configured to:
control the operations of the first switching element, the second switching element, and the third switching element based on the calculated temperature, and
add the difference between the second comparison temperature and the calculated temperature to the correction amount when the control device determines that the second comparison result changes from lower than the second comparison temperature to equal to or higher than the second comparison temperature, and that the calculated temperature is lower than the second comparison temperature.

5. The electric power conversion device according to claim 1,
wherein the control device is configured to reset the correction of the calculated temperature when the calculated temperature is lower than a predetermined reset temperature.

6. An electric power conversion device comprising:
a first switching element;
a second switching element connected in parallel with the first switching element;
a third switching element connected in parallel with the first switching element and the second switching element;
a control device having a central processing unit, the control device being configured to perform calculation and control by the central processing unit;
a first temperature sensor configured to detect the temperature of the first switching element;
a second temperature sensor configured to detect the temperature of the second switching element;
a third temperature sensor configured to detect the temperature of the third switching element;
a first transmission circuit configured to transmit a first signal indicating the temperature of the first switching element detected by the first temperature sensor to the to the control device;
a second transmission circuit configured to transmit a first comparison result indicating whether or not the temperature of the second switching element detected by the second temperature sensor is equal to or higher than a predetermined first comparison temperature;
a third transmission circuit configured to transmit a second comparison result indicating whether or not the temperature of the third switching element detected by the third temperature sensor is equal to or higher than a predetermined second comparison temperature; and
a fourth transmission circuit configured to transmit the first comparison result and the second comparison result to the control device through an OR circuit,
wherein the control device has a storage device configured to store the first comparison temperature, the second comparison temperature, and a correction amount, and
the control device is configured to:
calculate a calculated temperature using the first signal and the correction amount;
control the operations of the first switching element, the second switching element, and the third switching element based on the calculated temperature; and
add the difference between a high-temperature comparison temperature and the calculated temperature to the correction amount when the control device determines that the first comparison result changes from lower than the first comparison temperature to equal to or higher than the first comparison temperature or that the second comparison result changes from lower than the second comparison temperature to equal to or higher than the second comparison temperature, and that the calculated temperature is lower than a temperature of the high-temperature comparison temperature which is the higher temperature out of the first comparison temperature and the second comparison temperature.

7. The electric power conversion device according to claim 6,
wherein the control device is configured to make electric power output from the electric power conversion device lower than a current output when it is determined that the calculated temperature is equal to or higher than a limit temperature set to a higher temperature than the high-temperature comparison temperature.

8. The electric power conversion device according to claim 6,
wherein the first transmission circuit includes a first insulating coupler configured to transmit the first signal to the control device in a state where the first temperature sensor and the control device are electrically insulated from each other, and the fourth transmission circuit includes a fourth insulating coupler configured to transmit an output result of the OR circuit to the control device in a state where the OR circuit and the control device are electrically insulated from each other.

9. The electric power conversion device according to claim 6,
wherein the control device is configured to reset the correction of the calculated temperature when the calculated temperature is lower than a predetermined reset temperature.

* * * * *